US011336255B2

United States Patent
(12) United States Patent
Yamanouchi

(10) Patent No.: US 11,336,255 B2
(45) Date of Patent: May 17, 2022

(54) ACOUSTIC WAVE ELEMENT AND METHOD FOR MANUFACTURING SAME

(71) Applicant: ACOUSTIC WAVE DEVICE LABO. CO., LTD., Sendai (JP)

(72) Inventor: Kazuhiko Yamanouchi, Sendai (JP)

(73) Assignee: ACOUSTIC WAVE DEVICE LABO., LTD., Sendai (JP)

( * ) Notice: Subject to any disclaimer, the term of this patent is extended or adjusted under 35 U.S.C. 154(b) by 807 days.

(21) Appl. No.: 16/314,832

(22) PCT Filed: Feb. 14, 2018

(86) PCT No.: PCT/JP2018/005062
§ 371 (c)(1),
(2) Date: Jan. 2, 2019

(87) PCT Pub. No.: WO2018/151146
PCT Pub. Date: Aug. 23, 2018

(65) Prior Publication Data
US 2019/0253035 A1 Aug. 15, 2019

(30) Foreign Application Priority Data

Feb. 16, 2017 (JP) ............................ JP2017-026665
Apr. 7, 2017 (JP) ............................ JP2017-076372
(Continued)

(51) Int. Cl.
*H03H 9/02* (2006.01)
*H03H 3/10* (2006.01)
(Continued)

(52) U.S. Cl.
CPC .......... *H03H 9/02842* (2013.01); *H03H 3/02* (2013.01); *H03H 3/04* (2013.01);
(Continued)

(58) Field of Classification Search
CPC ............ H03H 9/02102; H03H 9/0211; H03H 9/02228; H03H 9/02543; H03H 9/02251;
(Continued)

(56) References Cited

U.S. PATENT DOCUMENTS 8,384,268 B2 * 2/2013 Kadota .............. H03H 9/02574
310/313 A

FOREIGN PATENT DOCUMENTS

JP S57-155825 A 9/1982
JP S59-156013 A 9/1984
(Continued)

OTHER PUBLICATIONS

Sep. 4, 2018 International Preliminary Report on Patentability issued in International Patent Application No. PCT/JP2018/005062.
(Continued)

*Primary Examiner* — Jeffrey M Shin
(74) *Attorney, Agent, or Firm* — Oliff PLC

(57) ABSTRACT

An acoustic wave element which can be reduced in size and produced relatively easily, practically used without using harmful substances, and can suppress a surface acoustic wave propagation loss, which has an excellent temperature coefficient of frequency and a velocity dispersion characteristic, and with which an increase in the reflection coefficient of interdigital transducers can be suppressed, and a method for manufacturing the acoustic wave element are provided. The acoustic wave element includes a pair of electrodes provided on both surfaces of a piezoelectric substrate, and a dielectric film provided on a first surface of the piezoelectric substrate so as to cover the electrode. The acoustic wave element alternatively includes interdigital transducers provided on a first surface of the piezoelectric substrate, and a
(Continued)

11a 11b 12 13a 10 11 12 22a 22b 22a 22b 13b 22a 22b 21 dielectric film provided on the interdigital transducers, a gap between the interdigital transducers, and/or a second surface of the piezoelectric substrate.

11 Claims, 14 Drawing Sheets

(30) Foreign Application Priority Data

May 25, 2017 (JP) ............................ JP2017-103165
Nov. 7, 2017 (JP) ............................ JP2017-215143
Nov. 28, 2017 (JP) ............................ JP2017-228208

(51) Int. Cl.
*H03H 9/05* (2006.01)
*H03H 9/13* (2006.01)
*H03H 9/145* (2006.01)
*H03H 9/17* (2006.01)
*H03H 9/19* (2006.01)
*H03H 9/25* (2006.01)
*H03H 9/56* (2006.01)
*H03H 9/64* (2006.01)
*H03H 3/04* (2006.01)
*H03H 3/02* (2006.01)

(52) U.S. Cl.
CPC ........... *H03H 3/10* (2013.01); *H03H 9/0211* (2013.01); *H03H 9/02023* (2013.01); *H03H 9/02031* (2013.01); *H03H 9/02039* (2013.01); *H03H 9/0259* (2013.01); *H03H 9/02102* (2013.01); *H03H 9/02228* (2013.01); *H03H 9/02543* (2013.01); *H03H 9/02551* (2013.01); *H03H 9/02559* (2013.01); *H03H 9/02574* (2013.01); *H03H 9/02637* (2013.01); *H03H 9/02834* (2013.01); *H03H 9/0561* (2013.01); *H03H 9/13* (2013.01); *H03H 9/145* (2013.01); *H03H 9/17* (2013.01); *H03H 9/174* (2013.01); *H03H 9/176* (2013.01); *H03H 9/19* (2013.01); *H03H 9/25* (2013.01); *H03H 9/562* (2013.01); *H03H 9/564* (2013.01); *H03H 9/6489* (2013.01); *H03H 2003/0407* (2013.01)

(58) Field of Classification Search
CPC .......... H03H 9/02559; H03H 9/02574; H03H 9/0259; H03H 9/02834; H03H 9/0561; H03H 9/13; H03H 9/145; H03H 9/17; H03H 9/174; H03H 9/176; H03H 9/19; H03H 9/25; H03H 9/562; H03H 9/564; H03H 9/6489
See application file for complete search history.

(56) References Cited

FOREIGN PATENT DOCUMENTS

| | | | |
|---|---|---|---|
| JP | H11-122071 | A | 4/1999 |
| JP | 2004-282515 | A | 10/2004 |
| JP | 2005-117641 | A | 4/2005 |
| JP | 2006-203839 | A | 8/2006 |
| JP | 2007-166148 | A | 6/2007 |
| JP | 2007-228011 | A | 9/2007 |
| JP | 2007-295504 | A | 11/2007 |
| JP | 2009-027689 | A | 2/2009 |
| JP | 2011-077682 | A | 4/2011 |
| JP | 2011-130513 | A | 6/2011 |
| JP | 2014-187568 | A | 10/2014 |
| WO | 2008-035546 | A1 | 3/2008 |
| WO | 2008-078481 | A1 | 7/2008 |
| WO | 2012-102131 | A1 | 8/2012 |

OTHER PUBLICATIONS

May 22, 2018 International Search Report issued in International Patent Application No. PCT/JP2018/005062.

Yamanouch, Kazuhiko, "High Coupling and Zero TCF SH-SAW and SH-Boundary SAW Using Electrodes/Rotated Y-X LiTaO3 and SiO2/Electrodes/Rotated Y-X LiTaO3" Tohoku University, Joint UFFC, EFTF and PFM Symposium, 2013, pp. 1061-1064.

Dewan, Namrata et al. "Temperature Stable LiNbO3 Surface Acoustic Wave Device with Diode Sputtered Amorphous TeO2 Over-Layer" Department of Physics and Astrophysics. University of Delhi, Applied Physics Letters, 2005. pp. 1-3.

* cited by examiner (A)

(B)

(A)

(B)

11a 41b 42b Up Down 31 50 13

(A) 11

ACOUSTIC WAVE ELEMENT AND METHOD FOR MANUFACTURING SAME

FIELD OF THE INVENTION

The present invention relates to an acoustic wave element and a method for manufacturing the same.

DESCRIPTION OF RELATED ART

As a conventional surface acoustic wave element using a thin film, a surface acoustic wave element in which a thin-film layer having a different acoustic impedance is disposed on a reverse side of a piezoelectric substrate so as to allow a surface acoustic wave leaking in the thickness direction of the piezoelectric substrate to reflect, so that deterioration of a Q value (acutance) is suppressed (see, for example, Patent Literature 1). Also disclosed is a surface acoustic wave element which includes a dielectric thin film such as $SiO_2$ film as a protective film on a surface of a piezoelectric substrate so as to protect a surface of the surface wave element. Herein, the dielectric thin film has a transverse wave velocity substantially the same as that of the piezoelectric substrate (see, for example, Patent Literature 2).

Furthermore, the present inventor has also developed a surface acoustic wave element using an Au thin film, having a transverse wave velocity slower than that of a piezoelectric substrate, as an interdigital transducer (IDT) on a surface of a piezoelectric substrate on which a pseudo surface acoustic wave propagates (see, for example, Non-Patent Literature 1). Furthermore, the present inventor has developed also a surface acoustic wave element in which a super-low-velocity thin film having a grating structure and a propagating velocity of the surface acoustic wave of 1000 m/s or less, or a $TeO_2$ thin film is attached on conductor electrodes or between the conductor electrodes of an interdigital transducer provided on a substrate on which a surface acoustic wave propagates, and a reflection coefficient is changed (see, for example, Patent Literature 3). Furthermore, an acoustic wave element has been proposed, in which a dielectric film having a large mass loading effect is attached to an interdigital transducer disposed on a piezoelectric substrate (see, for example, Patent Literature 4). Furthermore, a structure has been proposed, in which a metal film such as Ag or a thin film having a slow propagation velocity, such as bismuth germinate, is attached to a rotated Y-X propagation $LiNbO_3$ substrate (see, for example, Patent Literature 5).

Conventionally, as an oscillator and a resonator using a piezoelectric substrate having an excellent temperature coefficient of frequency (TCF), a quartz-crystal oscillator is generally used. However, quartz has a small electromechanical coupling coefficient and cannot be used for a wide-band filter or a variable frequency transmitter that requires a wide frequency range. Furthermore, a piezoelectric single crystal such as $LiNbO_3$ and $LiTaO_3$ having a large electromechanical coupling coefficient is not practical because the temperature coefficient of frequency thereof is large. Thus, in order to compensate such a large temperature characteristic, the present inventor has developed a surface acoustic wave substrate on which a $SiO_2$ film having a large film thickness ratio ($H/\lambda_{eff}$, where $\lambda_{eff}$ is an operation wavelength and H is a film thickness) and having a positive temperature coefficient of frequency has been attached to a piezoelectric substrate (see, for example, Patent Literature 6). Furthermore, also in a thin film resonator using a piezoelectric thin film, in order to obtain zero TCF, a substrate to which a $SiO_2$ thin film is attached is developed. Furthermore, by attaching a $TeO_2$ thin film having a positive temperature coefficient of frequency on a propagation path of a 128° rotated Y-cut X-propagation surface acoustic wave substrate, a surface acoustic wave device having improved delay-time temperature characteristic is developed (see, for example, Non-Patent Literature 2).

CITATION LIST

Patent Literatures

Patent Literature 1: JP-A-2007-228011
Patent Literature 2: JP-A-2011-130513
Patent Literature 3: JP-A-2007-295504
Patent Literature 4: WO2012/102131
Patent Literature 5: JP-A-S59-156013
Patent Literature 6: JP-A-2006-203839

Non-Patent Literatures

Non-Patent Literature 1: K. Yamanouchi, "High Coupling and Zero TCF SH-SAW and SH-Boundary SAW Using Electrodes/Rotated Y-X $LiTaO_3$ and $SiO_2$/Electrodes/Rotated Y-X $LiTaO_3$", 2012 IEEE Ultrasonics Symposium Proc., p. 1061-1064

Non-Patent Literature 2: N. Dewan, et al., "Temperature stable $LiNbO_3$ surface acoustic wave device with diode sputtered amorphous $TeO_2$ over-layer", APPLIED PHYSICS LETTERS, 2005, 86, 22350

SUMMARY OF THE INVENTION

However, the acoustic wave element described in Patent Literature 1 uses, as a thin-film layer, a diamond thin film whose longitudinal wave velocity is three times or more of that of the piezoelectric substrate, on the reverse side of the substrate. Therefore, there are problems that it is difficult to control a thickness of the piezoelectric substrate, propagation loss of the surface acoustic wave cannot be reduced, and spurious characteristic is poor. Furthermore, the acoustic wave element described in Patent Literature 2 has problems that since the transverse wave velocity of the protective film formed by a dielectric thin film is substantially the same as the transverse wave velocity of the piezoelectric substrate, the protective film is not a film that allows acoustic wave energy to concentrate on a surface, that is, the film does not aim at improving the temperature coefficient of frequency.

Furthermore, in the surface acoustic wave element described in Non-Patent Literature 1, a substrate whose propagation attenuation is zero is obtained on −10° to 50° rotated Y-cut X-propagation $LiTaO_3$ substrate by using an Au film having a large thickness to make a pseudo surface acoustic wave be a surface acoustic wave that propagates at a velocity slower than that of a slow transverse wave of the substrate. However, since a film thickness of the interdigital transducer is increased, there are problems that a propagation loss of the surface acoustic wave is increased, the reflection coefficient of the interdigital transducer is increased, and the film does not aim at improving the temperature coefficient of frequency. Furthermore, the surface acoustic wave element described in Patent Literature 3 has a structure of controlling reflection. However, there are problems that a propagation loss is large, and practical use is difficult because $TeO_2$ is a harmful substance if a $TeO_2$ thin film is used. Furthermore, the acoustic wave element described in Patent Literature 4 has problems that a dielectric film is used for increasing a mass loading effect and an electromechanical coupling coefficient, but not for improving the temperature coefficient of frequency or velocity dispersion characteristic. Furthermore, the surface acoustic wave element of Patent Literature 5 has problems that the dielectric film is a film having a waveguide structure, but not a structure in which a film is attached to the interdigital transducer, a film does not have a surface acoustic wave resonator structure, and a film is not a thin film that aims for improving the temperature coefficient of frequency.

Furthermore, in the surface acoustic wave substrate described in Patent Literature 6, in order to improve the temperature coefficient of frequency by $SiO_2$ film having a positive temperature coefficient of frequency on the piezoelectric substrate, a film thickness of the $SiO_2$ film is required to be large. Thereby, a propagation loss is increased, and production becomes difficult. Furthermore, the surface acoustic wave device described in Non-Patent Literature 2 has problems that it is not a structure in which a $TeO_2$ thin film is attached to the interdigital transducer, not a surface acoustic wave resonator structure, it is difficult to produce a $TeO_2$ thin film having a positive temperature coefficient of frequency, and practical use is difficult because $TeO_2$ is a harmful substance.

The present invention has been made in view of the above-described problems, and is based on an utterly new idea of improving the temperature coefficient of frequency using a large velocity dispersion characteristic of an acoustic wave substrate. The present invention has an object to provide an acoustic wave element which can be reduced in size and produced relatively easily, can be practically used without using harmful substances, which can suppress surface acoustic wave propagation loss, has an excellent temperature coefficient of frequency and velocity dispersion characteristic, and with which an increase in the reflection coefficient of interdigital transducers can be suppressed, and a method for manufacturing the acoustic wave element.

In order to achieve the object mentioned above, an acoustic wave element according to the present invention comprises: a piezoelectric substrate; a pair of electrodes respectively provided on both surfaces of the piezoelectric substrate; and a dielectric film provided on at least any one surface of the piezoelectric substrate so as to cover an electrode provided on the surface, wherein the piezoelectric substrate is a 33□ to 39□ rotated Y-cut X-propagation LiNbO3 substrate, a 161° to 167° rotated Y-cut X-propagation $LiNbO_3$ substrate, an $LiNbO_3$ substrate, a 44° to 50° rotated Y-cut X-propagation $LiTaO_3$ substrate, a 162° to 168° rotated Y-cut X-propagation $LiTaO_3$ substrate, an $LiTaO_3$ substrate, a langasite substrate, a quartz substrate, a ZnO substrate, a piezoelectric ceramics substrate, an AlN thin film substrate, a ZnO thin film substrate, a piezoelectric ceramics thin film substrate, or a ScAlN thin film substrate, in the dielectric film, an acoustic velocity of a propagating transverse wave is ⅔ times or less of an acoustic velocity of a slow transverse wave propagating through the piezoelectric substrate, and a surface acoustic wave velocity is 1010 m/s or more, and the dielectric film includes a $(Bi_2O_3)x(SiO_2 \text{ or } GeO_2)_{(1-x)}$ film wherein X is 0.3 to 1.0, a compound film including Bi, a BSO film, a BGO film, an $In_2O_3$ film, or a compound film including In. In this case, it is preferable that an acoustic wave propagates in a direction perpendicular to each surface of the piezoelectric substrate, and a temperature coefficient of frequency is in a range from −20 ppm/° C. to +5 ppm/° C. Furthermore, in each electrode, an acoustic velocity of a propagating transverse wave may be ⅔ times or less of an acoustic velocity of the slow transverse wave propagating through the piezoelectric substrate, and the surface acoustic wave velocity may be 1010 m/s or more. And each electrode or the interdigital transducers may include Au, Au/Cr, Ag, Ag/Cr, Bi, Bi/Cr, In, or an alloy of two or more thereof, or as a usual electrode or an interdigital transducer, Al, Zn, Ru, Cr, Cu/Cr, Pt, Pt/Cr, Pt/Ti, or an alloy of two or more thereof. Furthermore, each electrode or the interdigital transducers may include an electrode film made of Al, Zn, Ru, Cr, Cu/Cr, Pt, Pt/Cr, Pt/Ti, or an alloy of two or more thereof on Au, Au/Cr, Ag, Ag/Cr, Bi, Bi/Cr, In, or an alloy of two or more thereof. In this case, the velocity dispersion characteristic can further be increased, and a more excellent temperature coefficient of frequency and velocity dispersion characteristic can be obtained.

Furthermore, the acoustic wave element according to the present invention comprises: a piezoelectric substrate; interdigital transducers provided on a first surface of the piezoelectric substrate; and a dielectric film provided on the interdigital transducers, wherein the piezoelectric substrate is a −10° to 75° rotated Y-cut X-propagation $LiNbO_3$ substrate, a 120° to 170° rotated Y-cut X-propagation $LiNbO_3$ substrate, a Y-Z $LiNbO_3$ substrate, an X-cut 35° to 45° Y-propagation $LiNbO_3$ substrate, an X-cut 160° to 175° Y-propagation $LiNbO_3$ substrate, an LiNbO3 substrate, a −10° to 60° rotated Y-cut X-propagation $LiTaO_3$ substrate, an X-cut 35° to 45° Y-propagation $LiTaO_3$ substrate, an $LiTaO_3$ substrate, a langasite substrate, a quartz substrate, a ZnO substrate, a piezoelectric ceramics substrate, an AlN thin film substrate, a ZnO thin film substrate, a piezoelectric ceramics thin film substrate, or a ScAlN thin film substrate, in the dielectric film, an acoustic velocity of a propagating transverse wave is ⅔ times or less of an acoustic velocity of a slow transverse wave propagating through the piezoelectric substrate, and a surface acoustic wave velocity is 1010 m/s or more, and the dielectric film includes a $(Bi_2O_3)x(SiO_2 \text{ or } GeO_2)_{(1-x)}$ film wherein X is 0.3 to 1.0, a compound film including Bi, a BSO film, a BGO film, an $In_2O_3$ film, or a compound film including In. In this case, it is preferable that an acoustic wave propagates along each surface of the piezoelectric substrate, and/or in a direction perpendicular to each surface of the piezoelectric substrate, and a temperature coefficient of frequency is in a range from −20 ppm/° C. to +5 ppm/° C. Furthermore, in the interdigital transducers, an acoustic velocity of a propagating transverse wave may be ⅔ times or less of the acoustic velocity of the slow transverse wave propagating through the piezoelectric substrate, and the surface acoustic wave velocity may be 1010 m/s or more. And the interdigital transducers may include Au, Au/Cr, Ag, Ag/Cr, Bi, Bi/Cr, In, or an alloy of two or more thereof, or Al, Zn, Ru, Cr, Cu/Cr, Pt, Pt/Cr, Pt/Ti, or an alloy of two or more thereof. Furthermore, the interdigital transducers may include an electrode film made of Al, Zn, Ru, Cr, Cu/Cr, Pt, Pt/Cr, Pt/Ti, or an alloy of two or more thereof on Au, Au/Cr, Ag, Ag/Cr, Bi, Bi/Cr, In, or an alloy of two or more thereof. Also in this case, the velocity dispersion characteristic can further be increased, and a more excellent temperature coefficient of frequency and velocity dispersion characteristic can be obtained.

The acoustic wave element according to the present invention can constitute, for example, an acoustic wave oscillator, an acoustic wave resonator, a bulk wave resonator, a piezoelectric thin film resonator, a surface acoustic wave oscillator, a surface acoustic wave resonator, an acoustic wave filter element, a surface acoustic wave filter element, a resonator having excellent temperature characteristic, a delay line, a high sensitive sensor that does not need temperature compensation, and the like. The piezoelectric substrate may include a piezoelectric single crystal substrate, a piezoelectric ceramics substrate, a substrate having a structure in which a piezoelectric single crystal is attached to a support substrate, or a substrate having a piezoelectric thin film structure attached to the support substrate. Furthermore, acoustic waves to be used are a Rayleigh wave, a longitudinal wave, a transverse wave, a pseudo longitudinal wave mainly including a longitudinal wave, a pseudo transverse wave mainly including a transverse wave, a surface acoustic wave having propagation velocity slower than a slow transverse wave of the piezoelectric substrate, a Love wave, a Lamb wave, a pseudo surface acoustic wave having propagation velocity faster than the slow transverse wave of the piezoelectric substrate, or a pseudo longitudinal surface acoustic wave having propagation velocity faster than the fast transverse wave of the piezoelectric substrate.

In the acoustic wave element according to the present invention, the acoustic velocity of the transverse wave of at least the dielectric film is ⅔ times or less of an acoustic velocity of a slow transverse wave propagating through the piezoelectric substrate. Therefore, when the acoustic wave element is constructed as an element for surface acoustic wave, it is possible to obtain a surface acoustic wave whose energy radiation of the acoustic wave leaking into the piezoelectric substrate becomes zero, and to obtain a substrate having a large velocity dispersion characteristic. Furthermore, it is possible to achieve a rotation angle which allows propagation attenuation of the pseudo surface acoustic wave to be zero, and to obtain a substrate having a large velocity dispersion characteristic. Furthermore, the temperature coefficient of frequency can be brought close to a value of zero. Furthermore, the element can be reduced in size. Thus, when the surface acoustic wave is used, the propagation loss can be suppressed, energy of the surface acoustic wave can be concentrated on the surface of the piezoelectric substrate, and the Q value and the velocity dispersion characteristic can be increased. Furthermore, since thicknesses of the electrode and the dielectric film can be reduced, manufacture becomes easy and size can be reduced.

In the acoustic wave element according to the present invention, an increase in the reflection coefficient of the interdigital transducers can be also suppressed by the dielectric film. Furthermore, with a thin dielectric film, a large reflection coefficient and a small propagation loss can be achieved. Furthermore, it is possible to achieve a large velocity dispersion characteristic using each electrode or the interdigital transducers, and the dielectric film. By providing them to a piezoelectric substrate having a negative value of the temperature coefficient of frequency, the temperature coefficient of frequency can be improved to values near zero or positive values, and an excellent temperature coefficient of frequency can be obtained. Furthermore, use of the velocity dispersion characteristic of the interdigital transducers and the dielectric film makes it possible to construct a filter having a wide bandwidth and a low-loss property, and to control the dispersion characteristic of the filter. The acoustic wave element according to the present invention does not need to use harmful substances such as $TeO_2$ as a dielectric film, and thus, it can be put into a practical use with other highly safe materials.

In the acoustic wave element according to the present invention, when $h/\lambda_{eff}$=0.005 to 0.3 and $H/\lambda_{eff}$=0.01 to 0.3 may be satisfied where $\lambda_{eff}$ represents a wavelength of an acoustic wave propagating through the piezoelectric substrate, h represents a thickness of the each electrode or each of the interdigital transducers, and H represents a film thickness of the dielectric film. In this case, in particular, since the velocity dispersion characteristic is increased, the temperature coefficient of frequency can be further improved. Therefore, a more excellent temperature coefficient of frequency and velocity dispersion characteristic can be obtained.

The acoustic wave element according to the present invention may include a $SiO_2$ film or a dielectric film for temperature compensation between the piezoelectric substrate provided with each electrode or the interdigital transducers, and the dielectric film, or may include a $SiO_2$ film on the dielectric film. In this case, by using a very thin $SiO_2$ film or dielectric film for temperature compensation, an excellent temperature characteristic can be obtained. The $SiO_2$ film satisfies, for example, $H/\lambda_{eff}$=0.005 to 0.15 where H represents a film thickness, and $\lambda_{eff}$ represents a wavelength of acoustic wave propagating through the piezoelectric substrate. The dielectric film for temperature compensation may be made of any materials as long as they can achieve temperature compensation, and examples thereof include SiOF, a langasite-based thin film, $SiO_2$ including impurity, and the like.

In the acoustic wave element according to the present invention, each electrode or the interdigital transducers may include an electrode film made of Au, Au/Cr, Ag, Ag/Cr, Bi, Bi/Cr, In, or an alloy of two or more thereof, or made of Al, Zn, Ru, Cr, Cu, Cu/Cr, Pt, Pt/Ti, or an alloy of two or more thereof, or made of Al, Zn, Ru, Cr, Cu, Cu/Cr, Pt, Pt/Cr, Pt/Ti, or an alloy of two or more thereof on Au, Au/Cr, Ag, Ag/Cr, Bi, Bi/Cr, In, or an alloy of two or more thereof. In these cases, since the acoustic velocity of the transverse wave of the interdigital transducer is much slower than that of the piezoelectric substrate, the velocity dispersion characteristic can be further increased.

The acoustic wave element regarding the present invention includes a piezoelectric substrate; and a pair of electrodes respectively provided on both surfaces of the piezoelectric substrate. Each electrode may be formed of a metal electrode film, in which an acoustic velocity of a propagating transverse wave may be ⅔ times or less of an acoustic velocity of a slow transverse wave propagating through the piezoelectric substrate, and a surface acoustic wave velocity may be 1010 m/s or more. A temperature coefficient of frequency may be in a range from −20 ppm/° C. to +5 ppm/° C. When $\lambda_{eff}$ represents a wavelength of an acoustic wave propagating through the piezoelectric substrate, and h represents a thickness of each electrode, $h/\lambda_{eff}$=0.005 to 0.3 may be satisfied. Furthermore, the acoustic wave element regarding the present invention includes a piezoelectric substrate, and interdigital transducers provided on a first surface of the piezoelectric substrate. The interdigital transducers are made of a metal electrode film, an acoustic velocity of a propagating transverse wave may be ⅔ times or less of an acoustic velocity of a slow transverse wave propagating through the piezoelectric substrate, and a surface acoustic wave velocity may be 1010 m/s or more. A temperature coefficient of frequency may be in a range from −20 ppm/° C. to +5 ppm/° C., and when $\lambda_{eff}$ represents a wavelength of an acoustic wave propagating through the piezoelectric substrate, and h represents a thickness of one of the interdigital transducers, $h/\lambda_{eff}$=0.005 to 0.3 may be satisfied.

In this case, the acoustic velocity of each electrode of positive and negative electrodes or the interdigital transducers formed of metal electrode film is ⅔ times or less of an acoustic velocity of a slow transverse wave propagating through the piezoelectric substrate. Therefore, when the acoustic wave element is constructed as an element for surface acoustic wave, it is possible to obtain a surface acoustic wave whose energy radiation of the acoustic wave leaking into the piezoelectric substrate becomes zero, and to obtain a substrate having a large velocity dispersion characteristic. Furthermore, it is possible to achieve a substrate having a rotation angle and a film thickness which allow propagation attenuation of the pseudo surface acoustic wave to be zero, and to obtain a substrate having a large velocity dispersion characteristic. Furthermore, the element can be reduced in size. Thus, when the surface acoustic wave is used, the propagation loss can be suppressed, and energy of the surface acoustic wave can be concentrated on the surface of the piezoelectric substrate, and the Q value and the velocity dispersion characteristic can be increased. In this way, without using the dielectric film, the velocity dispersion characteristic can be increased, and an excellent temperature coefficient of frequency can be obtained. Furthermore, it is not necessary to use harmful substances such as $TeO_2$, so that practical use can be achieved using other safe materials.

Furthermore, in this case, the piezoelectric substrate may be a 33° to 39° rotated Y-cut X-propagation $LiNbO_3$ substrate, a 161° to 167° rotated Y-cut X-propagation $LiNbO_3$ substrate, a −10° to 75° rotated Y-cut X-propagation $LiNbO_3$ substrate, a 120° to 170° rotated Y-cut X-propagation $LiNbO_3$ substrate, a Y-Z $LiNbO_3$ substrate, an X-cut 35° to 45° Y-propagation $LiNbO_3$ substrate, an X-cut 160° to 175° Y-propagation $LiNbO_3$ substrate, an $LiNbO_3$ substrate, a −10° to 60° rotated Y-cut X-propagation $LiTaO_3$ substrate, an X-cut 35° to 45° Y-propagation $LiTaO_3$ substrate, a 44° to 50° rotated Y-cut X-propagation $LiTaO_3$ substrate, a 162° to 168° rotated Y-cut X-propagation $LiTaO_3$ substrate, an $LiTaO_3$ substrate, a langasite substrate, a quartz substrate, a ZnO substrate, a piezoelectric ceramics substrate, an AlN thin film substrate, a ZnO thin film substrate, a piezoelectric ceramics thin film substrate, or a ScAlN thin film substrate, and each electrode or the interdigital transducers includes an electrode film made of Au, Au/Cr, Ag, Ag/Cr, Bi, Bi/Cr, In, or an alloy of two or more thereof, or made of Al, Zn, Ru, Cr, Cu/Cr, Pt, Pt/Cr, Pt/Ti, or an alloy of two or more thereof on Au, Au/Cr, Ag, Ag/Cr, Bi, Bi/Cr, In, or an alloy of two or more thereof. Thus, a more excellent temperature coefficient of frequency and velocity dispersion characteristic can be obtained.

The acoustic wave element according to the present invention may have a configuration in which when a number of electrodes alternately arranged in the interdigital transducer is 2N+1, and when $\lambda_N$ is an operating center wavelength of the propagating acoustic wave, $V_N$ is a velocity of the acoustic wave at the time, $V_n$ is a velocity of the acoustic wave when the wavelength of the acoustic wave is represented by $\lambda n=\lambda_N[1+\{N-(n-1)\}\delta]$ where n is 1 to 2N+1, a value of $N\delta$ is 0.005 to 0.3, and a value of $a_n$ is 0.8 to 1.2, a width of the n-th electrode is represented by $L_n=X_n/2=a_n(\lambda_n/4)\times(V_n/V_N)$, and a center-to-center interval of neighboring electrodes is represented by $X_n=a_n(\lambda_n/2)\times(V_n/V_N)$. Also in this case, the velocity dispersion characteristic can be increased.

A method for manufacturing an acoustic wave element according to the present invention includes vapor-depositing each electrode or the interdigital transducers, and/or the dielectric film at a temperature higher than a central operating temperature of the acoustic wave element by 100° C. or more, or at a temperature lower than the central operating temperature of the acoustic wave element by 100° C. or more.

With the method for manufacturing an acoustic wave element according to the present invention, by controlling the temperature at the time of vapor deposition, distortion is generated in the pair of electrodes or the interdigital transducers, and the dielectric film, and the velocity of respective acoustic waves can be changed largely. Thus, the temperature coefficient of frequency of an acoustic wave element can further be improved, and an acoustic wave element having an excellent temperature coefficient of frequency can be manufactured.

The present invention can provide an acoustic wave element which can be reduced in size and produced relatively easily, can be practically used without using harmful substances, which can suppress surface acoustic wave propagation loss, has an excellent temperature coefficient of frequency and a velocity dispersion characteristic, and with which an increase in the reflection coefficient of interdigital transducers can be suppressed, and a method for manufacturing the acoustic wave element.

DETAILED DESCRIPTION OF THE INVENTION

Hereinafter, embodiments of the present invention will be described with reference to drawings.

Figure 1:
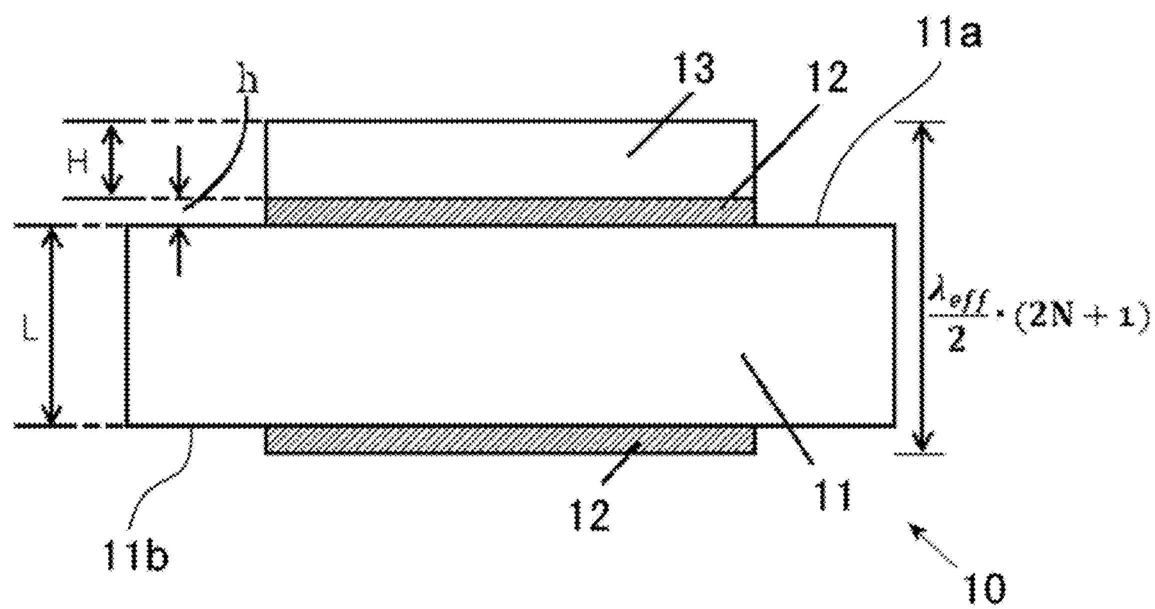
FIG. 1 is a sectional view showing an acoustic wave element in a first embodiment of the present invention.
Figure 2:
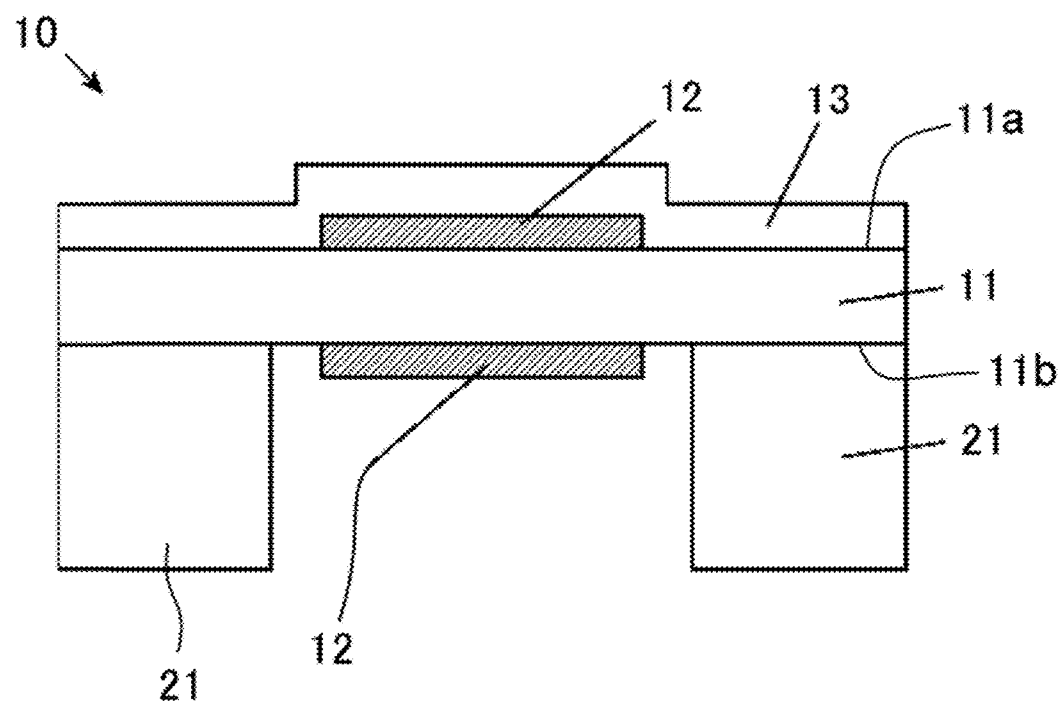
FIG. 2 is a sectional view showing a modified example of an acoustic wave element including a support substrate in the first embodiment of the present invention.
Figure 3:
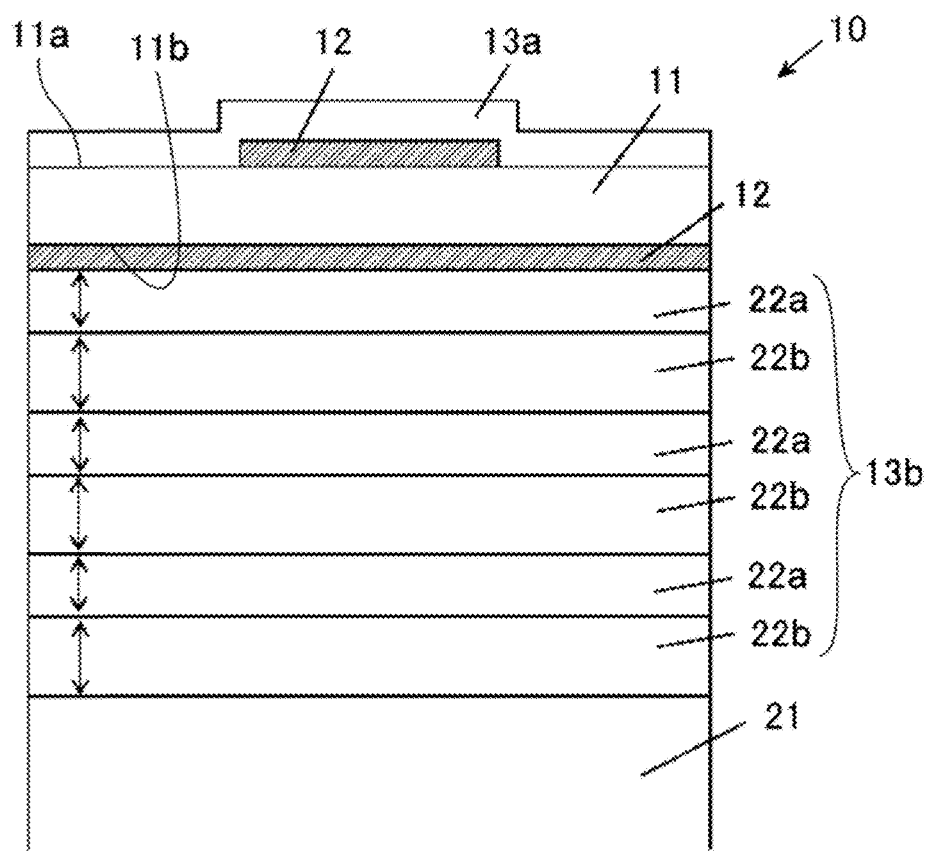
FIG. 3 is a sectional view showing a modified example of an acoustic wave element including a dielectric film reflector having a multilayer structure in the first embodiment of the present invention.

Configuration of Acoustic Wave Element in the First Embodiment of the Present Invention FIGS. 1 to 3 show an acoustic wave element in the first embodiment of the present invention.

As shown in FIG. 1, an acoustic wave element 10 in the first embodiment of the present invention includes a piezoelectric substrate 11, a pair of electrodes 12, and a dielectric film 13.

The piezoelectric substrate 11 includes a substrate having a flat plate structure or a piezoelectric thin film. The piezoelectric substrate 11 includes a 33° to 39° rotated Y-cut X-propagation $LiNbO_3$ substrate, a 161° to 167° rotated Y-cut X-propagation $LiNbO_3$ substrate, an $LiNbO_3$ substrate, a 44° to 50° rotated Y-cut X-propagation $LiTaO_3$ substrate, a 162° to 168° rotated Y-cut X-propagation $LiTaO_3$ substrate, an $LiTaO_3$ substrate, a langasite substrate, a quartz substrate, a ZnO substrate, a piezoelectric ceramics substrate, an AlN thin film substrate, a ZnO thin film substrate, a piezoelectric ceramics thin film substrate, or a SLAIN thin film substrate.

A pair of positive and negative electrodes 12 are provided to both surfaces 11*a* and 11*b* of the piezoelectric substrate 11, respectively. Each electrode 12 includes Au, Au/Cr, Ag, Ag/Cr, Bi, Bi/Cr, In, or an alloy of two or more thereof. At this time, in each electrode 12, acoustic velocity of a propagating transverse wave may be ⅔ times or less of an acoustic velocity of a slow transverse wave propagating through the piezoelectric substrate, and the surface acoustic wave velocity may be 1010 m/s or more. Furthermore, each electrode 12 is formed of usual electrodes, and may include Al, Zn, Ru, Cr, Cu, Cu/Cr, Pt, Pt/Cr, Pt/Ti, or an alloy of two or more thereof. Furthermore, a combination of each electrode 12 and usual electrodes may be employed.

The dielectric film 13 is provided so as to cover only electrode 12 provided on the surface of a first surface 11*a* of piezoelectric substrate 11. Dielectric film 13 includes a $(Bi_2O_3)_X(SiO_2 \text{ or } GeO_2)_{(1-X)}$ film [where X is 0.3 to 1.0], a compound film including Bi, a BSO film, a BGO film, an $In_2O_3$ film, or a compound film including In.

In the dielectric film 13, the acoustic velocity of the transverse wave is ⅔ times or less of an acoustic velocity of a slow transverse wave propagating through the piezoelectric substrate 11, and the surface acoustic wave velocity is 1010 m/s or more. In the acoustic wave element 10, by applying a voltage between the electrodes 12, the acoustic wave propagates in the direction perpendicular to each of the surfaces of the piezoelectric substrate 11. Furthermore, in the acoustic wave element 10, the temperature coefficient of frequency is in a range from −20 ppm/° C. to +5 ppm/° C.

The acoustic wave element 10 satisfies $f_0=V_{eff}/\lambda_{eff}$, and $L=(\lambda_{eff}/2)\times(2N+1)$ (N is an integer including 0), where $f_0$ represents an operating resonance frequency, $\lambda_{eff}$ represents a wavelength (operation wavelength) of an acoustic wave propagating through the piezoelectric substrate 11, $V_{eff}$ represents a velocity of the acoustic wave, and L represents a total film thickness of the piezoelectric substrate 11, the dielectric film 13, and the electrode 12.

Note here that as shown in FIG. 2, the acoustic wave element 10 includes dielectric film 13 on the first surface 11*a* of piezoelectric substrate 11 so as to cover electrode 12 provided on the surface and a portion on which the electrode 12 is not provided. Furthermore, the acoustic wave element 10 may include a pair of support substrates 21 at both ends of the second surface 11*b* of the piezoelectric substrate 11. In this case, acoustic wave causes vibration of the piezoelectric substrate 11 between the support substrates 21.

Furthermore, as shown in FIG. 3, the acoustic wave element 10 includes dielectric films 13*a* and 13*b* on both surfaces 11*a* and 11*b* of piezoelectric substrate 11 so as to cover electrodes 12 provided on both surfaces, respectively. The dielectric film 13*b* provided on a second surface 11*b* side of piezoelectric substrate 11 has a multilayer structure including a first reflection film 22*a* and a second reflection film 22*b*, which reflect an acoustic wave. Furthermore, the acoustic wave element 10 may include a support substrate 21 provided so as to cover the dielectric film 13*b* having a multilayer structure.

Configuration of Acoustic Wave Element in the Second Embodiment of the Present Invention FIGS. 4 to 9 show an acoustic wave element in a second embodiment of the present invention.

Figure 4:
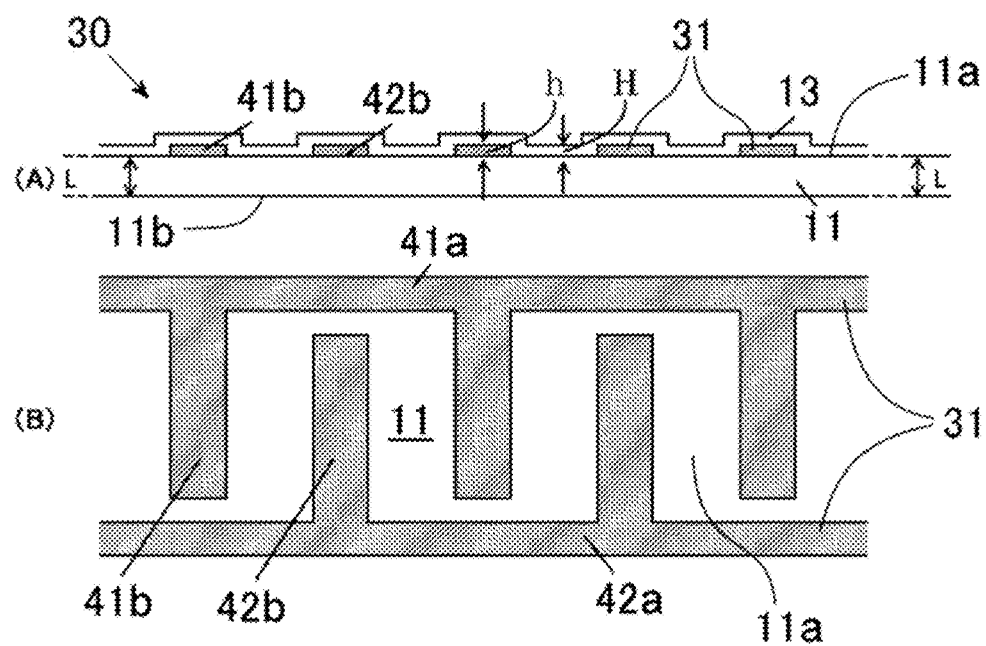
FIG. 4 shows an acoustic wave element in a second embodiment of the present invention, and (A) is a sectional view thereof, and (B) is a plan view thereof in which a dielectric film is omitted.

As shown in FIG. 4, an acoustic wave element 30 in the second embodiment of the present invention includes a piezoelectric substrate 11, interdigital transducers 31, and a dielectric film 13. Note here that in the following description, the same reference numerals are given to the same configurations as those in the acoustic wave element 10 in the first embodiment of the present invention, and redundant description thereof will be omitted.

The piezoelectric substrate 11 is formed of a substrate having a flat plate structure or a piezoelectric thin film. The piezoelectric substrate 11 includes a −10° to 75° rotated Y-cut X-propagation $LiNbO_3$ substrate, a 120° to 170° rotated Y-cut X-propagation $LiNbO_3$ substrate, an $LiNbO_3$ substrate, a −5° to 60° rotated Y-cut X-propagation $LiTaO_3$ substrate, an $LiTaO_3$ substrate, a langasite substrate, a quartz substrate, a ZnO substrate, an AlN thin film substrate, a ZnO thin film substrate, or a ScAlN thin film substrate.

The interdigital transducers 31 is provided on the first surface 11*a* of the piezoelectric substrate 11. The interdigital transducers 31 is made of Au, Au/Cr, Ag, Ag/Cr, Bi, Bi/Cr, In, or an alloy of two or more thereof. At this time, the acoustic velocity of the transverse wave propagating in each of the interdigital transducers 31 may be ⅔ or less of the acoustic velocity of the slow transverse wave propagating in the piezoelectric substrate 11, and the surface acoustic wave velocity may be 1010 m/s or more. Furthermore, the interdigital transducers 31 may be made of usual electrodes, and may be made of Al, Zn, Ru, Cr, Cu, Cu/Cr, Pt, Pt/Cr, Pt/Ti, or an alloy of two or more thereof. Furthermore, a combination of the interdigital transducers 31 and usual electrodes may be employed.

The interdigital transducer 31 includes a positive electrode side bus bar 41*a*, a negative electrode side bus bar 42*a*, a plurality of positive electrodes 41*b*, and a plurality of negative electrodes 42*b*. The positive electrode side bus bar 41*a* and negative electrode side bus bar 42*a* are arranged in parallel to each other at a predetermined interval. Positive electrodes 41*b* are provided at intervals along the positive electrode side bus bar 41*a* so as to vertically extend from the positive electrode side bus bar 41*a* toward the negative electrode side bus bar 42*a*. Negative electrodes 42*b* are provided at intervals along the negative electrode side bus bar 42*a* so as to vertically extend from the negative electrode side bus bar 42*a* toward the positive electrode side bus bar 41*a*. The positive electrodes 41*b* and negative electrodes 42*b* are alternately arranged along the positive electrode side bus bar 41*a* and the negative electrode side bus bar 42*a*, respectively, with equal or different periods so as not to be brought into contact with each other.

The dielectric film 13 is provided on the interdigital transducers 31, the first surface 11*a* of piezoelectric substrate 11 in a gap between interdigital transducers 31, and/or a second surface 11*b* of the piezoelectric substrate 11. In the dielectric film 13, the acoustic velocity of each propagating transverse wave is ⅔ times or less of the acoustic velocity of a slow transverse wave propagating through the piezoelectric substrate 11, and the surface acoustic wave velocity is 1010 m/s or more. In the acoustic wave element 30, the acoustic wave propagates along each surface of the piezoelectric substrate 11, and in the direction perpendicular to the surface of the piezoelectric substrate 11. Furthermore, in the acoustic wave element 30, the temperature coefficient of frequency is in a range from −20 ppm/° C. to +5 ppm/° C.

Figure 5:
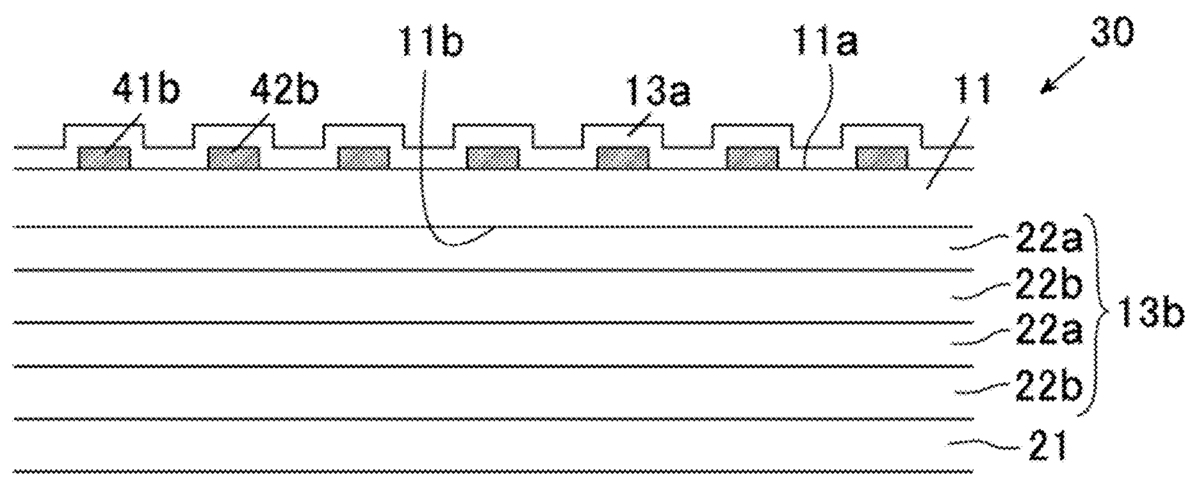
FIG. 5 is a sectional view showing a modified example of an acoustic wave element including a dielectric film reflector having a multilayer structure in the second embodiment of the present invention.
Figure 6:
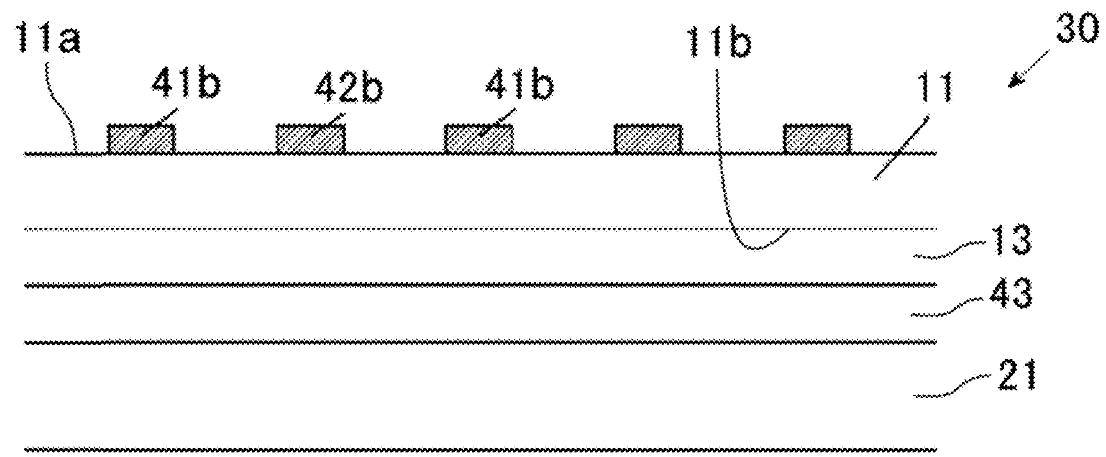
FIG. 6 is a sectional view showing a modified example of an acoustic wave element in which a dielectric film is not provided on a piezoelectric substrate surface of an interdigital transducer side, in the second embodiment of the present invention.

Furthermore, as shown in FIG. 5, the acoustic wave element 30 includes the dielectric film 13*b* having a multilayer structure including the first reflection film 22*a* and the second reflection film 22*b* reflecting an acoustic wave also on the second surface 11*b* of the piezoelectric substrate 11. Furthermore, the acoustic wave element 30 may include a support substrate 21 provided so as to cover the dielectric film 13*b* having a multilayer structure. In this case, in the acoustic wave element 30, the acoustic wave propagates along each surface of the piezoelectric substrate 11. Furthermore, as shown in FIG. 6, the acoustic wave element 30 may not include a dielectric film 13 at a first surface 11*a* side of the piezoelectric substrate 11, and may include the dielectric film 13 only at a second surface 11*b* side of the piezoelectric substrate 11, and may include a reflection film 43 made of a dielectric substance and provided so as to cover the dielectric film 13, and a support substrate 21 so as to cover the reflection film 43. The reflection film 43 has a transverse wave velocity larger than that of the piezoelectric substrate 11, and can reflect an acoustic wave. In this case, in the acoustic wave element 30, an acoustic wave propagates along each surface of the piezoelectric substrate 11.

Figure 7:
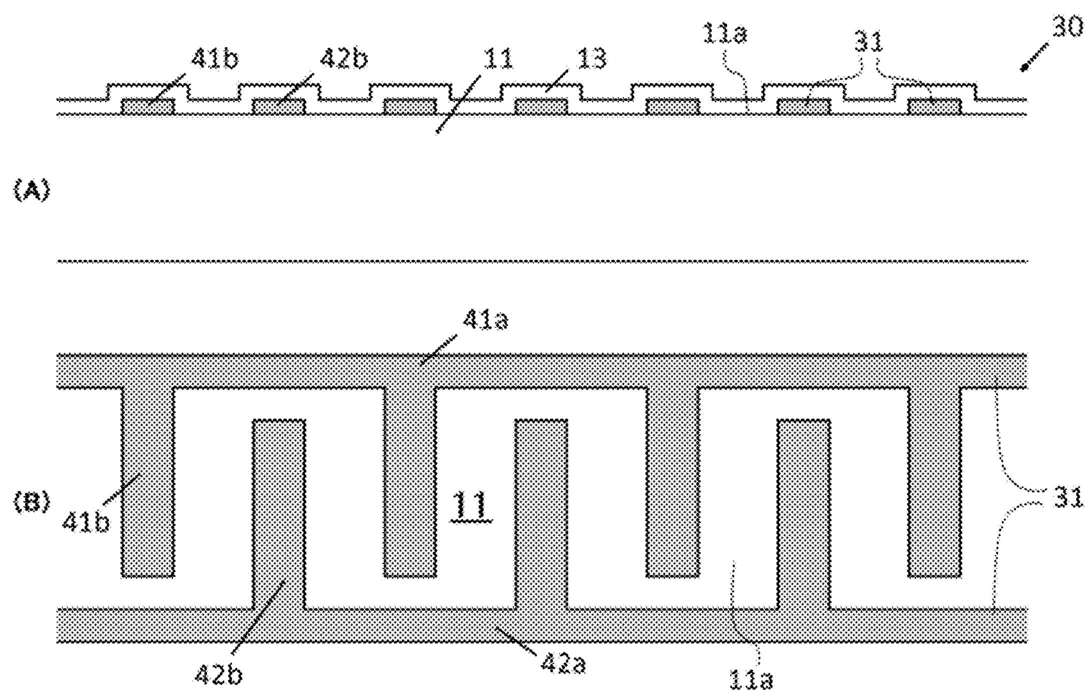
FIG. 7 shows an acoustic wave element of a modified example in the second embodiment of the present invention in which a surface acoustic wave or a pseudo surface acoustic wave propagates along a surface of the piezoelectric substrate in the acoustic wave element, and (A) is a sectional view thereof, and (B) is a plan view thereof in which a dielectric film is omitted.
Figure 8:
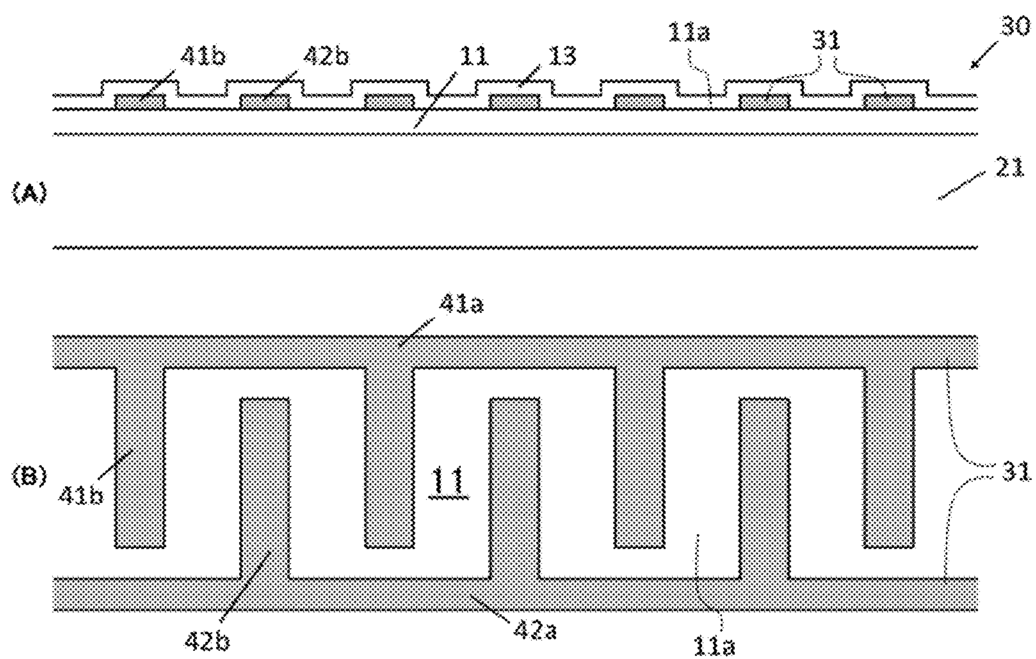
FIG. 8 shows an acoustic wave element of a modified example in the second embodiment of the present invention in which a surface acoustic wave or a pseudo surface acoustic wave propagates along a surface of the piezoelectric substrate including a support substrate, and (A) is a sectional view thereof, and (B) is a plan view thereof in which a dielectric film is omitted.
Figure 9:
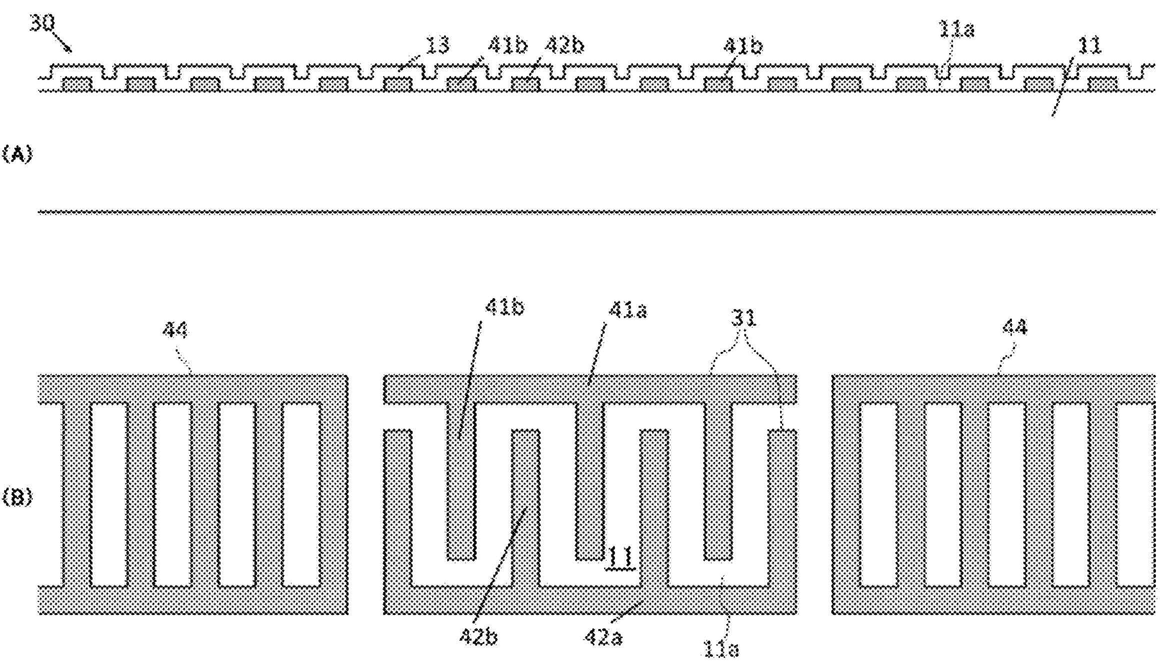
FIG. 9 shows an acoustic wave element of a modified example in the second embodiment of the present invention in which a pair of reflectors are provided so as to sandwich interdigital transducers, and (A) is a sectional view thereof, and (B) is a plan view thereof in which a dielectric film is omitted.

Furthermore, as shown in FIG. 7, the acoustic wave element 30 may have a configuration in which the dielectric film 13 is made of a thin film, and a surface acoustic wave propagates along the surface of the piezoelectric substrate 11. Furthermore, as shown in FIG. 8, the acoustic wave element 30 may have a configuration in which a support substrate 21 is provided, the dielectric film 13 is formed of a thin film, and a surface acoustic wave or a pseudo surface acoustic wave propagates along the surface of the piezoelectric substrate 11. Furthermore, as shown in FIG. 9, the acoustic wave element 30 may include a resonator including a pair of reflectors 44 having multiple electrode fingers in which the reflectors 44 are provided on the first surface 11*a* of piezoelectric substrate 11 so as to sandwich the interdigital transducer 31. The dielectric film 13 is provided so as to cover not only the interdigital transducer 31 but also each reflector 44. Also in this case, the surface acoustic wave propagates along the surface of the piezoelectric substrate 11.

Action of Acoustic Wave Element in the First and Second Embodiments of the Present Invention Next, an action of the acoustic wave elements 10 and 30 in the first and second embodiments of the present invention will be described.

The acoustic wave elements 10 and 30 can constitute, for example, an acoustic wave oscillator, an acoustic wave resonator, a bulk wave resonator, a piezoelectric thin film resonator, a surface acoustic wave oscillator, a surface acoustic wave resonator, an acoustic wave filter element, a surface acoustic wave filter element, a resonator having an excellent temperature characteristic, a delay line, a high sensitive sensor that does not need temperature compensation, and the like. Furthermore, acoustic waves to be used are a Rayleigh wave, a longitudinal wave, a transverse wave, a pseudo longitudinal wave mainly including a longitudinal wave, a pseudo transverse wave mainly including a transverse wave, a surface acoustic wave having propagation velocity slower than that of a slow transverse wave of the piezoelectric substrate, a Love wave, a Lamb wave, a pseudo surface acoustic wave having propagation velocity faster than the slow transverse wave of the piezoelectric substrate, or a pseudo longitudinal surface acoustic wave having propagation velocity faster than the fast transverse wave of the piezoelectric substrate.

In the acoustic wave elements 10 and 30, the acoustic velocity of the transverse wave of at least the dielectric film 13 is ⅔ times or less of an acoustic velocity of a slow transverse wave propagating through the piezoelectric substrate 11. Therefore, when the acoustic wave element is constructed as an element for surface acoustic wave, it is possible to obtain a surface acoustic wave whose energy radiation of the acoustic wave leaking into the piezoelectric substrate 11 becomes zero, and to obtain a substrate having a large velocity dispersion characteristic. Furthermore, it is possible to achieve a rotation angle which allows propagation attenuation of the pseudo surface acoustic wave to be zero, and to obtain a substrate having a large velocity dispersion characteristic. Furthermore, the element can be reduced in size. Thus, when the surface acoustic wave is used, the propagation loss can be suppressed, energy of the surface acoustic wave can be concentrated on the surface of the piezoelectric substrate 11, and the Q value and the velocity dispersion characteristic can be increased. Furthermore, since thicknesses of the electrode 12 and the dielectric film 13 can be reduced, fabrication becomes easy and size can be reduced.

Furthermore, when the acoustic wave elements 10 and 30 are provided with a dielectric film 13, adjustment of the center frequency and temperature compensation can be carried out. Thus, for example, when a pair of the interdigital transducers 31 are provided, dielectric film 13 is provided on an interdigital transducer 31 having higher center frequency, the center frequency is adjusted. Thereby, the center frequency of surface acoustic wave excited or received by the interdigital transducers 31 can be made equal. Furthermore, with this method, frequency of the filter can be adjusted.

Furthermore, the acoustic wave elements 10 and 30 invention may include a $SiO_2$ film or a dielectric film for temperature compensation between the piezoelectric substrate 11 provided with each electrode 12 or the interdigital transducers 31, and the dielectric film 13, or may include a $SiO_2$ film on the dielectric film 13. In this case, by using a very thin $SiO_2$ film or dielectric film for temperature compensation, an excellent temperature characteristic can be obtained. The $SiO_2$ film satisfies, for example, $H/\lambda_{eff}$=0.005 to 0.15 where H represents a film thickness, and $\lambda_{eff}$ represents a wavelength of acoustic wave propagating through the piezoelectric substrate. Examples of the dielectric film for temperature compensation include SiOF, a langasite-based thin film, $SiO_2$ including impurity, and the like.

Temperature Coefficient of Frequency (TCF)

A temperature coefficient of frequency (TCF) of the acoustic wave elements 10 and 30 is given by the following formula:

$$TCF=TCV-\alpha \quad (1).$$

Herein, TCV represents a velocity-temperature coefficient, and a represents a linear expansion coefficient in the propagation direction. TCV is given by the following formula (2), $$TCV=[(V_{t1}-T_{t2})/V_{t1}]/(t_1-t_2) \quad (2)$$

wherein the velocity at temperature $t_1$ is represented by $V_{t1}$, and the velocity at temperature $t_2$ is represented by $V_{t2}$.

In general, since many substances expand as temperature rises, α is a positive value. Furthermore, since a substance becomes softer as temperature rises, TCV becomes a negative value. TCF of $LiNbO_3$ single crystal substrate used in the acoustic wave elements 10 and 30 is in the range from −50 ppm/° C. to −100 ppm/° C., and TCF of $LiTaO_3$ single crystal substrate is in the range of −25 ppm/° C. to −50 ppm/° C. Thus, conventionally, in order to obtain zero TCF, a $SiO_2$ thin film having a positive temperature coefficient of frequency is used.

Example 1

Figure 10:
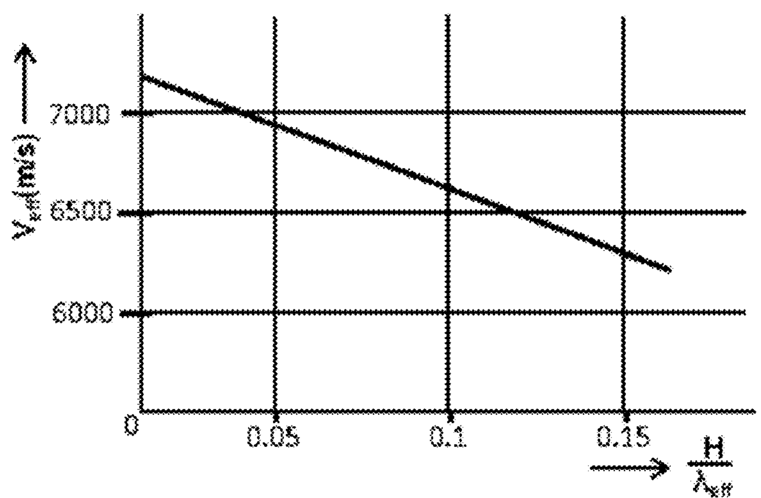
FIG. 10 is a graph showing a change of a velocity of a longitudinal pseudo-acoustic wave ($V_{eff}$) with respect to a film thickness ratio $H/\lambda_{eff}$ (where $\lambda_{eff}$ represents an operation wavelength) when an Al electrode is provided on a 36° rotated Y-cut X-propagation $LiNbO_3$ substrate, and a dielectric film (film thickness: H) made of $Bi_2O_3$ is further provided thereon in the acoustic wave element in the first or second embodiment of the present invention.

When a dielectric film 13 (film thickness: H) made of $Bi_2O_3$ is provided on a pseudo longitudinal acoustic wave resonator on which Al films (thickness of a film: h) as a pair of electrodes 12 are provided on both surfaces 11*a* and 11*b* of a 36° rotated Y-cut X-propagation $LiNbO_3$ piezoelectric substrate 11 at a film thickness ratio $h/\lambda_{eff}$ of 0.01 (herein, $\lambda_{eff}$ represents an operation wavelength) in a structure shown in FIG. 1, the velocity of the pseudo longitudinal acoustic wave ($V_{eff}$) with respect to a film thickness ratio $H/\lambda_{eff}$ is obtained by simulation. The results are shown in FIG. 10. As shown in FIG. 10, it has been shown that as the film thickness ratio $H/\lambda_{eff}$ is reduced, the velocity of the longitudinal pseudo-acoustic wave ($V_{eff}$) is largely increased, and a large negative velocity dispersion characteristic is shown.

Figure 11:
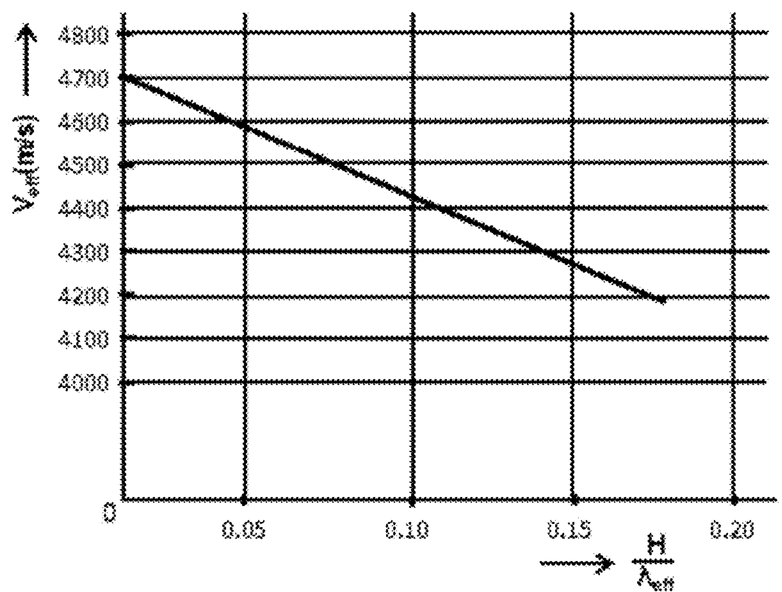
FIG. 11 is a graph showing a change of a velocity of a transverse pseudo-acoustic wave ($V_{eff}$) with respect to a film thickness ratio $H/\lambda_{eff}$ (where $\lambda_{eff}$ represents an operation wavelength) when an Al electrode is provided on a 164° rotated Y-cut X-propagation $LiTaO_3$ substrate, and a dielectric film (film thickness: H) made of $Bi_2O_3$ is further provided thereon in the acoustic wave element in the first or second embodiment of the present invention.

Similarly, when a dielectric film 13 (film thickness: H) made of $Bi_2O_3$ is provided on a transverse pseudo-acoustic wave resonator on which Al films (thickness of a film: h) as a pair of electrodes 12 are respectively provided on both surfaces 11*a* and 11*b* of a 164° rotated Y-cut X-propagation $LiTaO_3$ piezoelectric substrate 11 at a film thickness ratio $h/\lambda_{eff}$ of 0.01, the velocity of the transverse pseudo-acoustic wave ($V_{eff}$) with respect to a film thickness ratio $H/\lambda_{eff}$ is obtained by simulation. The results are shown in FIG. 11. As shown in FIG. 11, it has been shown that a large negative velocity dispersion characteristic is shown.

Figure 12:
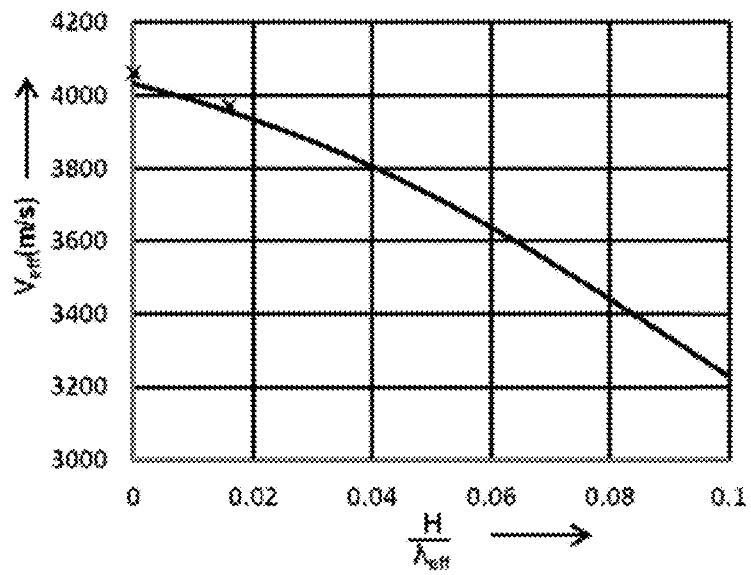
FIG. 12 is a graph showing a change of a velocity of surface pseudo-acoustic wave ($V_{eff}$) with respect to a film thickness ratio $H/\lambda_{eff}$ (where $\lambda_{eff}$ represents an operation wavelength) when an Al electrode is provided on a 36° rotated Y-cut X-propagation $LiTaO_3$ substrate, and a dielectric film (film thickness: H) made of $Bi_2O_3$ is further provided thereon in the acoustic wave element in the first or second embodiment of the present invention.

Similarly, when a dielectric film 13 (film thickness: H) made of $Bi_2O_3$ is provided on a pseudo surface acoustic wave resonator on which Al films (thickness of a film: h) as a interdigital transducers 31 are provided on a surface 11*a* of a semi-infinite plane 36° rotated Y-cut X-propagation $LiTaO_3$ substrate (piezoelectric substrate 11) at a film thickness ratio $h/\lambda_{eff}$ of 0.01, the velocity of the pseudo surface acoustic wave ($V_{eff}$) with respect to a film thickness ratio $H/\lambda_{eff}$ is obtained by simulation. The results are shown in FIG. 12. As shown in FIG. 12, it has been shown that a large negative velocity dispersion characteristic is shown.

Such a large negative velocity dispersion characteristic is considered to be because the acoustic velocity of the transverse wave propagating through the dielectric film 13 is ⅔ times or less of an acoustic velocity of a slow transverse wave propagating through the piezoelectric substrate 11. It has been shown that a large negative velocity dispersion characteristic is similarly shown in each electrode 12 or the interdigital transducer 31 when thickness of each electrode 12 or the interdigital transducer 31 is h.

In a resonator and a transducer corresponding to FIGS. 1 to 9, and FIGS. 15 to 17, TCF of piezoelectric substrate 11, each electrode 12, an interdigital transducers 31, and a dielectric film 13 is, each singly, a positive value for α, and a negative value for TCV. Only negative TCF is obtained as a whole. In a structure of the acoustic wave element, a film thickness of the dielectric film 13, each electrode 12, and the interdigital transducers 31 is much smaller than a thickness of the support substrate 21 of the piezoelectric substrate 11. Therefore, due to values of the linear expansion coefficient in the propagation direction and in-plane direction of the piezoelectric substrate 11 and the support substrate 21, the dielectric film 13, each electrode 12, and the interdigital transducers 31 undergo thermal distortion due to changes in temperature. When the linear expansion coefficient in the propagation direction of the piezoelectric substrate 11 or the support substrate 21 is a positive value, when the temperature rises, $\lambda_{eff}$ is increased according to the size of the positive linear expansion coefficient. Therefore, by the increase of $\lambda_{eff}$ and thermal distortion of the dielectric film 13, each electrode 12, and the interdigital transducers 31, values $H/\lambda_{eff}$ and $h/\lambda_{eff}$ are reduced. At this time, from graphs in FIGS. 10 to 12, and 19 to 21, the value of V is increased, TCV by the velocity dispersion becomes a positive value, and TCV represented by the formula (2) is increased and brought near to a positive value. Therefore, when the dielectric film 13, each electrode 12, and the interdigital transducers 31 are provided, even when a film thickness of the dielectric film 13, each electrode 12, or the interdigital transducers 31 is small, the temperature coefficient of frequency is largely improved. In this way, in the acoustic wave elements 10 and 30, even when the temperature coefficient of frequency of the piezoelectric substrate 11, the support substrate 21, each electrode 12 or the interdigital transducers 31, and the dielectric film 13 are a negative value, when the velocity dispersion characteristic and thermal distortion are considered, the temperature coefficient of frequency that is near zero can be obtained.

Note here that it is considered that changing temperature at the time of vapor-depositing each electrode 12, the interdigital transducers 31, and the dielectric film 13 can increase distortion in the dielectric film 13, and that the improvement effect of the temperature coefficient of frequency can be further increased. It is preferable that the vapor deposition temperature at this time is, for example, a temperature higher by 100° C. or more than the central operating temperature of the acoustic wave elements 10 and 30, or a temperature lower by 100° C. or more than the central operating temperature of the acoustic wave elements 10 and 30.

Example 2

A conventional acoustic wave element having Cu/Cr-structured interdigital transducers 31 on a 36° rotated Y-cut X-propagation $LiTaO_3$ substrate (piezoelectric substrate 11) was produced, and the resonance admittance characteristics at 20° C. and 35° C. were examined. The results are shown in FIGS. 13(A) and 13(B), respectively. Furthermore, an acoustic wave element 30 having Cu/Cr-structured interdigital transducers 31 on a 36° rotated Y-cut X-propagation $LiTaO_3$ substrate (piezoelectric substrate 11), and further having a dielectric film 13 made of $Bi_2O_3$ thereon was made, and the resonance admittance characteristic at 20° C. and 35° C. was examined. The results are shown in FIGS. 14(A) and 14(B), respectively.

Figure 13:
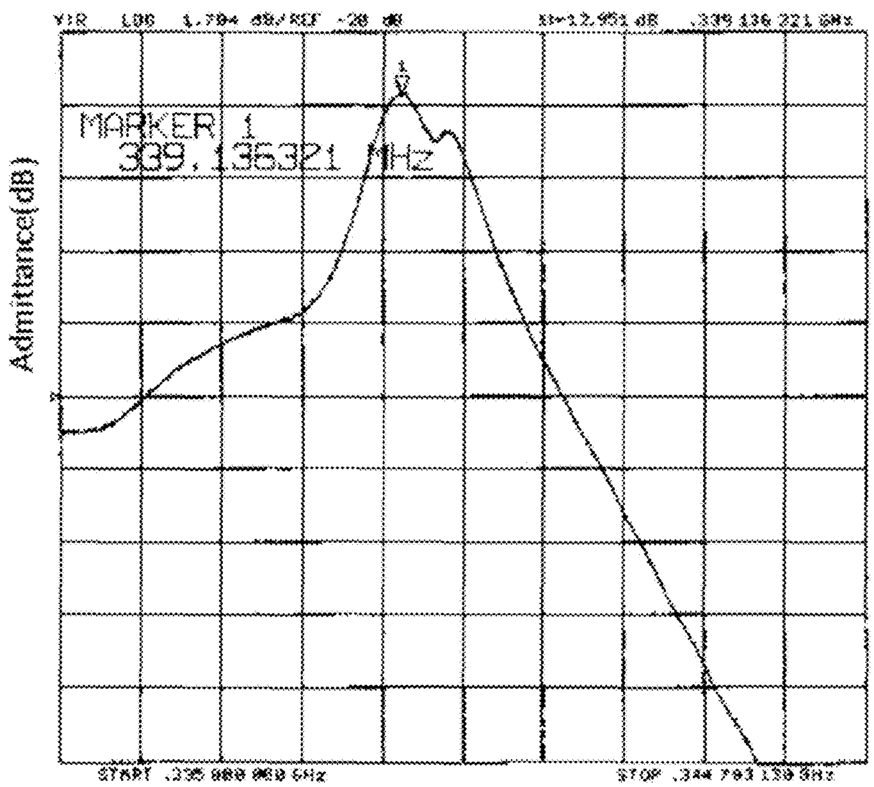
FIG. 13 is a graph showing a resonance admittance characteristic at (A) 20° C. and (B) 35° C. in an acoustic wave element having Cu/Cr-structured interdigital transducers on a conventional 36° rotated Y-cut X-propagation $LiTaO_3$ substrate (the abscissa shows frequency).
Figure 13:
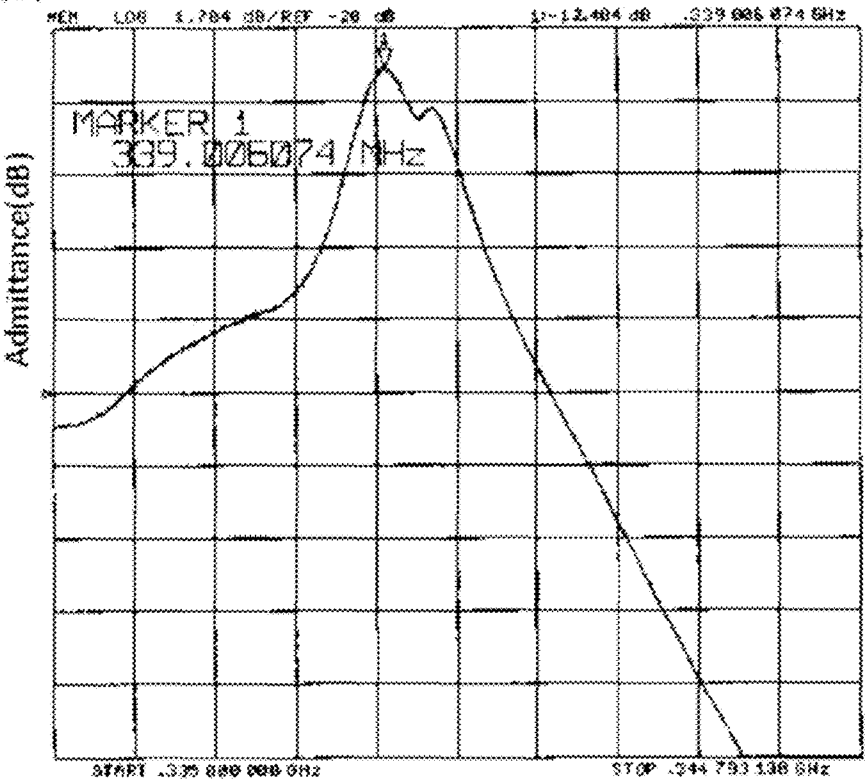
Figure 14:
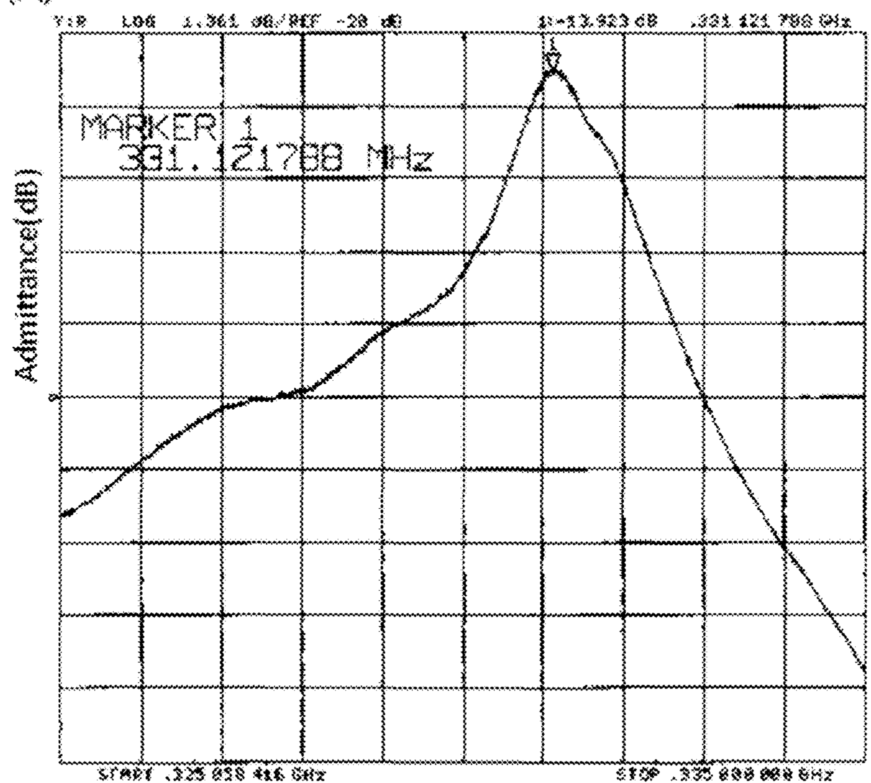
FIG. 14 is a graph showing a resonance admittance characteristic at (A) 20° C. and (B) 35° C. in an acoustic wave element having Cu/Cr-structured interdigital transducers on a 36° rotated Y-cut X-propagation $LiTaO_3$ substrate and a dielectric film made of $Bi_2O_3$ is further provided thereon in the acoustic wave element in the second embodiment of the present invention (the abscissa shows frequency).
Figure 14:
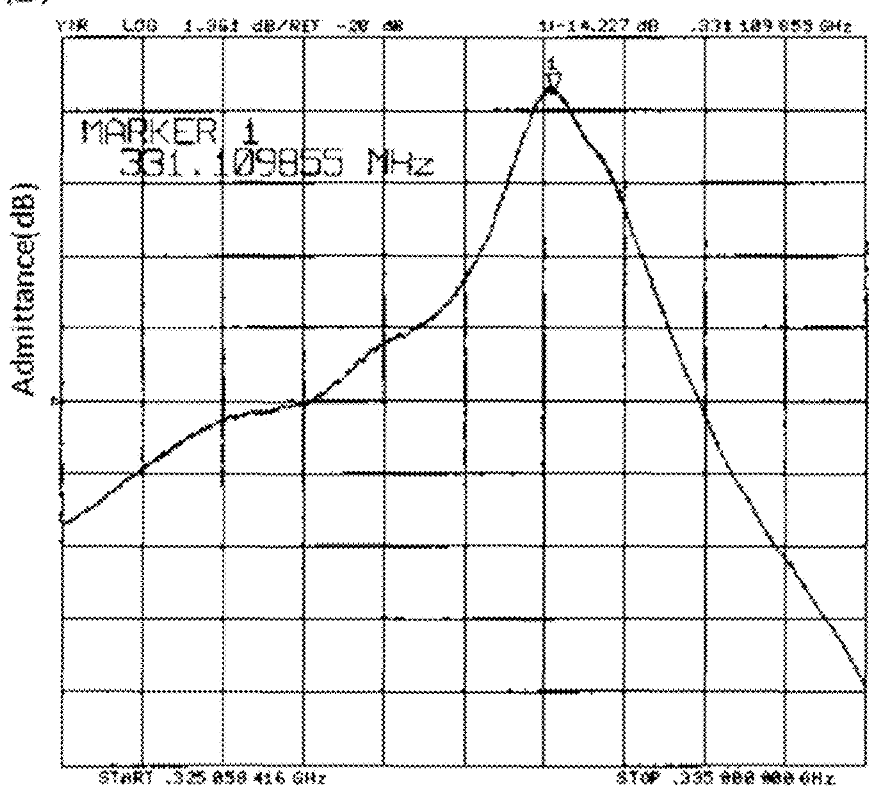

When a temperature coefficient of frequency TCF is obtained from peak position at each temperature of the resonance admittance characteristic shown in FIG. 13, TCF is −25 ppm/° C. It has been shown that in the acoustic wave element which does not include dielectric film 13, and does not obtain a large dispersion characteristic, only a value that is substantially equal to TCF of the piezoelectric substrate 11 is obtained. On the contrary, when the temperature coefficient of frequency TCF is obtained from FIG. 14, TCF is −5 ppm/° C. It has been shown that by providing the dielectric film 13, the temperature coefficient of frequency is improved by +20 ppm/° C. Note here that the result of the velocity obtained from the acoustic wave element 30 of FIGS. 13 and 14 are shown in FIG. 12 with the mark “x”. As shown in FIG. 12, it has been shown that the values coincide well with theoretical value.

Figure 15:
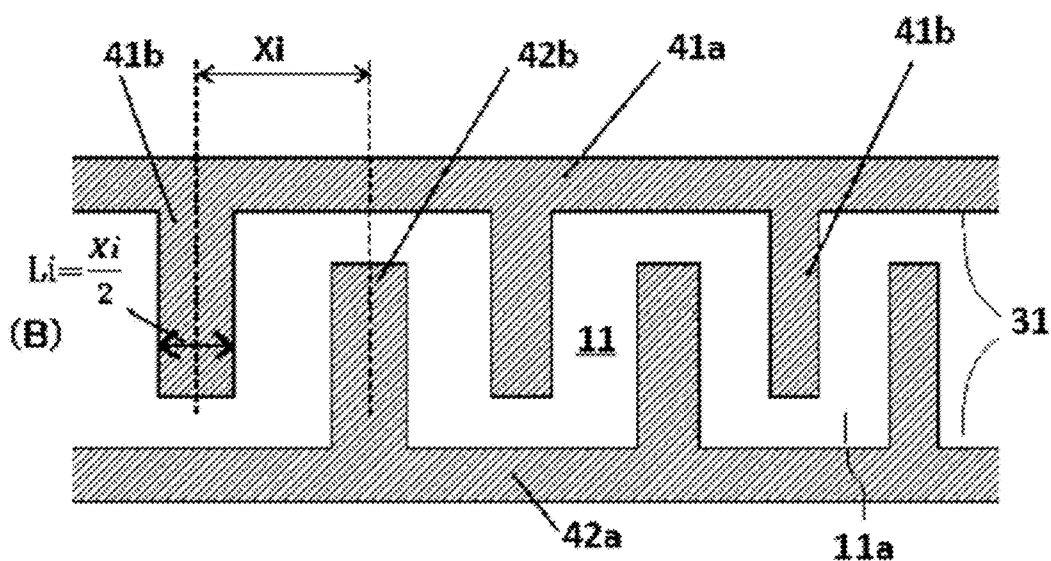
FIG. 15 shows an acoustic wave element in a third embodiment of the present invention, and (A) is a sectional view thereof, and (B) is a plan view thereof in which a dielectric film is omitted.

Configuration of Acoustic Wave Element in the Third Embodiment of the Present Invention FIG. 15 shows an acoustic wave element in a third embodiment of the present invention.

As shown in FIG. 15, an acoustic wave element 50 in the third embodiment of the present invention includes a piezoelectric substrate 11, interdigital transducers 31, and a dielectric film 13. Note here that in the following description, the same reference numerals are given to the same configurations as those in the acoustic wave elements 10 and 30 in the first and second embodiments of the present invention, and redundant description thereof will be omitted.

The interdigital transducer 31 is a distribution type. In the acoustic wave element 50, when a number of positive electrodes 41*b* and negative electrodes 42*b* that are alternately arranged in the interdigital transducer 31 is 2N+1, and when $\lambda_N$ is an operating center wavelength of the propagating acoustic wave, $V_N$ is a velocity of the acoustic wave at the time, $V_n$ is a velocity of the acoustic wave when the wavelength of the acoustic wave is represented by $\lambda n=\lambda_N[1+\{N-(n-1)\}\delta]$ (where n is 1 to 2N+1), a value of Nδ is 0.005 to 0.3, and a value of $a_n$ may be 0.8 to 1.2, a width of the n-th electrode is represented by $L_n=X_n/2=a_n(\lambda_n/4)\times(V_n/V_N)$, and a center-to-center interval of neighboring electrodes may be represented by $X_n=a_n(X_n/2)\times(V_n/V_N)$. In this case, an acoustic wave transducer and a surface acoustic wave transducer in a wide frequency range can be obtained.

Figure 16:
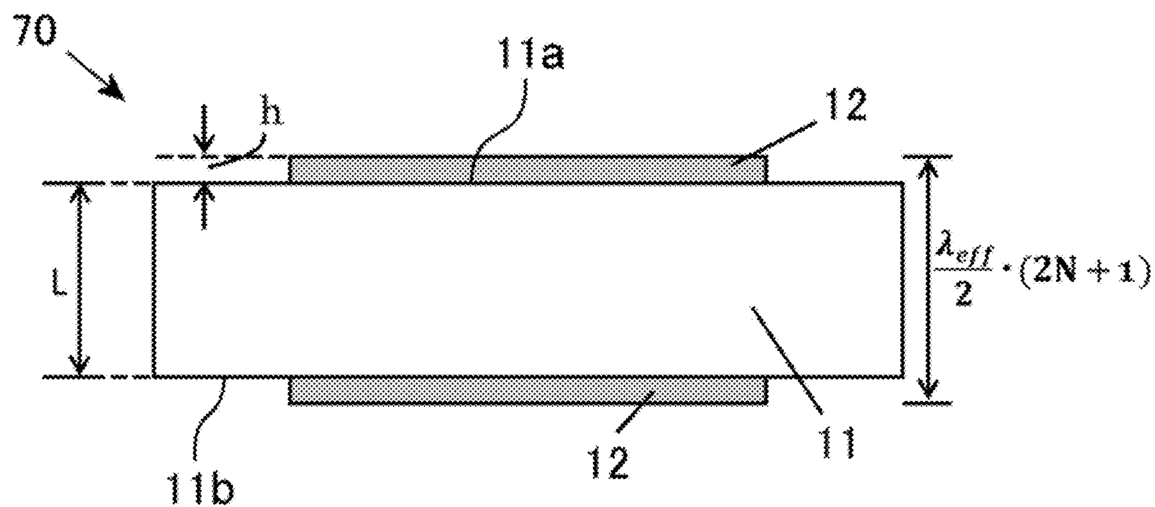
FIG. 16 is a sectional view of a configuration having a pair of electrodes in an acoustic wave element in a fourth embodiment of the present invention.
Figure 17:
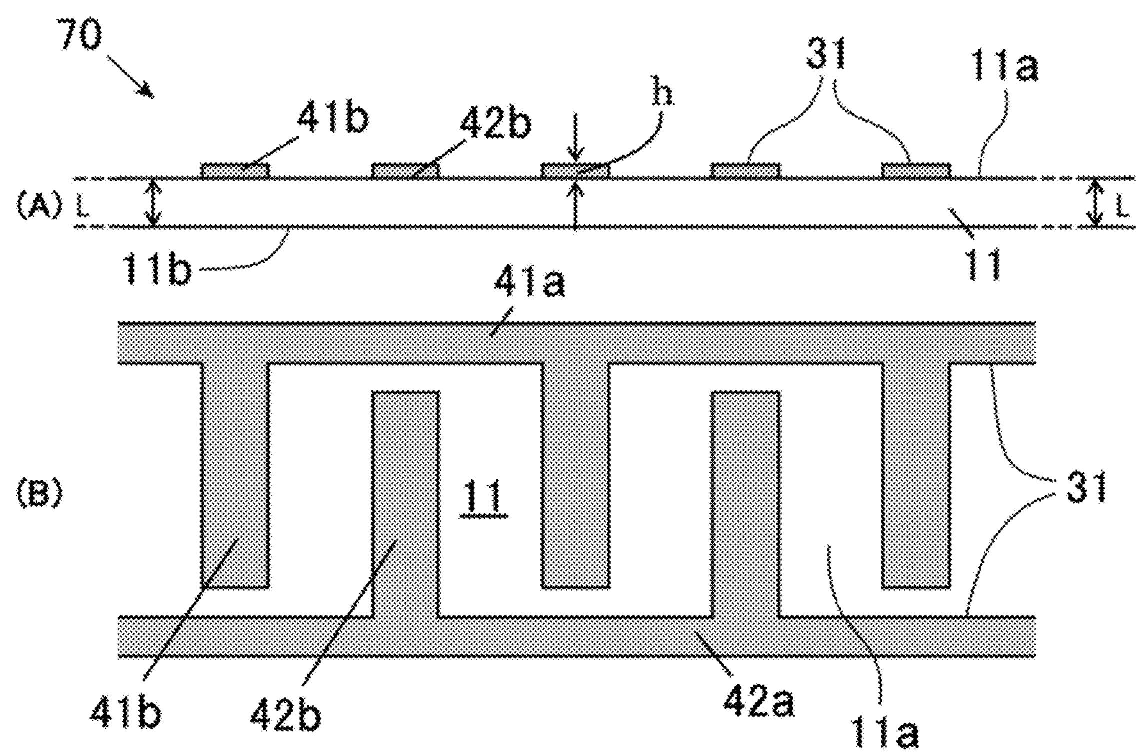
FIG. 17 shows a configuration having interdigital transducers in the acoustic wave element in the fourth embodiment of the present invention, and (A) is a sectional view thereof, and (B) is a plan view thereof.

Configuration of Acoustic Wave Element in the Fourth Embodiment of the Present Invention FIGS. 16 and 17 show an acoustic wave element in a fourth embodiment of the present invention.

As shown in FIGS. 16 and 17, an acoustic wave element 70 in the fourth embodiment of the present invention includes a piezoelectric substrate 11, and a pair of electrodes 12 or the interdigital transducers 31. Note here that in the following description, the same reference numerals are given to the same configurations as those in the acoustic wave elements 10 and 30 in the first and second embodiments of the present invention, and redundant description thereof will be omitted.

In the form shown in FIG. 16, a pair of electrodes 12 are made of a metal electrode film, and are provided on both surfaces 11*a* and 11*b* of piezoelectric substrate 11, respectively. Each electrode 12 is made of Au, Au/Cr, Ag, Ag/Cr, Bi, Bi/Cr, In, Pb, Pb/Cr, or an alloy of two or more thereof. Furthermore, in each electrode 12, an acoustic velocity of a propagating transverse wave is ⅔ times or less of an acoustic velocity of a slow transverse wave propagating through the piezoelectric substrate 11, and the surface acoustic wave velocity is 1010 m/s or more. The acoustic wave element 70 satisfies $h/\lambda_{eff}$=0.005 to 0.3, when a wavelength of the acoustic wave propagating through the piezoelectric substrate 11 is $\lambda_{eff}$, and a thickness of each electrode 12 is h. Note here that each electrode 12 may be an electrode including a composition of a metal electrode film and usual electrode.

Furthermore, in the form shown in FIG. 17, a piezoelectric substrate 11 has a parallel plate structure, and the interdigital transducer 31 is made of a metal electrode film and is formed on the first surface 11*a* of piezoelectric substrate 11. Alternatively, the piezoelectric substrate 11 has a semi-infinite flat structure, and the interdigital transducer 31 is made of a metal electrode film and is provided on the surface 11*a* of the piezoelectric substrate 11. The interdigital transducer 31 is made of Au, Au/Cr, Ag, Ag/Cr, Bi, Bi/Cr, In, or an alloy of two or more thereof. Furthermore, in the interdigital transducer 31, an acoustic velocity of a propagating transverse wave is ⅔ times or less of an acoustic velocity of a slow transverse wave propagating through the piezoelectric substrate 11, and the surface acoustic wave velocity is 1010 m/s or more. The acoustic wave element 70 satisfies $h/\lambda_{eff}$=0.005 to 0.3, when $\lambda_{eff}$ represents a wavelength of the acoustic wave propagating through the piezoelectric substrate 11, and h represents a thickness of the interdigital transducer 31. Note here that the interdigital transducer 31 may be an electrode including a composition of a metal electrode film and usual electrode.

Next, an action is described.

In acoustic wave element 70, the acoustic velocity of a transverse wave of each electrode 12 or the interdigital transducers 31 formed of metal electrode film is ⅔ times or less of an acoustic velocity of a slow transverse wave propagating through the piezoelectric substrate 11. Therefore, when the acoustic wave element is constructed as an element for surface acoustic wave, it is possible to obtain a surface acoustic wave whose energy radiation of acoustic wave leaking into the piezoelectric substrate 11 becomes zero, and to obtain a substrate having a large velocity dispersion characteristic. Furthermore, it is possible to achieve a rotation angle which allows the propagation attenuation of the pseudo surface acoustic wave to be zero, and to obtain a substrate having a large velocity dispersion characteristic. Furthermore, the element can be reduced in size. Thus, when the surface acoustic wave is used, or when a pseudo surface acoustic wave whose propagation attenuation is zero is used, the propagation loss can be suppressed, and energy of the surface acoustic wave can be concentrated on the surface of the piezoelectric substrate 11, and the Q value and the velocity dispersion characteristic can be increased. In this way, without using the dielectric film, the velocity dispersion characteristic can be increased, and an excellent temperature coefficient of frequency can be obtained. Furthermore, it is not necessary to use harmful substances such as $TeO_2$, so that practical use can be achieved using other highly safe materials.

Note here that the acoustic wave element 70 may include a pair of support substrates respectively provided on both ends of the second surface 11*b* of the piezoelectric substrate 11. This corresponds to, for example, a structure in which dielectric film 13 is removed from FIG. 2. The structure allows the piezoelectric substrate 11 between the support substrates to vibrate by an acoustic wave. Furthermore, the acoustic wave element 70 may include a dielectric substance provided so as to cover the electrode 12 of the second surface 11*b* of piezoelectric substrate 11 and having a multilayer structure including the first reflection film and the second reflection film reflecting an acoustic wave, and a support substrate provided so as to cover the dielectric substance having a multilayer structure. This corresponds to, for example, a structure in which dielectric films 13*a* and 13*b* are removed from FIG. 3.

Furthermore, the acoustic wave element 70 may include a dielectric substance provided so as to cover the second surface 11*b* of piezoelectric substrate 11 and having a multilayer structure including the first reflection film and the second reflection film reflecting an acoustic wave, and a support substrate provided so as to cover the dielectric substance having a multilayer structure. This corresponds to, for example, a structure in which dielectric film 13*a* is removed from FIG. 5, such that the acoustic wave propagates along each surface of the piezoelectric substrate 11. Furthermore, the acoustic wave element 70 may include a reflection film provided so as to cover the second surface 11*b* of piezoelectric substrate 11 and made of a dielectric substance, and a support substrate provided so as to cover the reflection film. The reflection film has a transverse wave velocity that is higher than that of the piezoelectric substrate 11 and can reflect an acoustic wave. This corresponds to, for example, a structure in which dielectric film 13 is removed from FIG. 6, and the acoustic wave propagates along each surface of the piezoelectric substrate 11. Furthermore, the acoustic wave element 70 may include a pair of reflectors made of multiple electrode fingers, and each reflector may include a resonator provided so as to sandwich interdigital transducers 31 with respect to the first surface 11*a* of piezoelectric substrate 11. This corresponds to, for example, a structure in which dielectric film 13 is removed from FIG. 9, such that the surface acoustic wave or the pseudo surface acoustic wave propagate along the surface of the piezoelectric substrate 11.

Example 3

Figure 18:
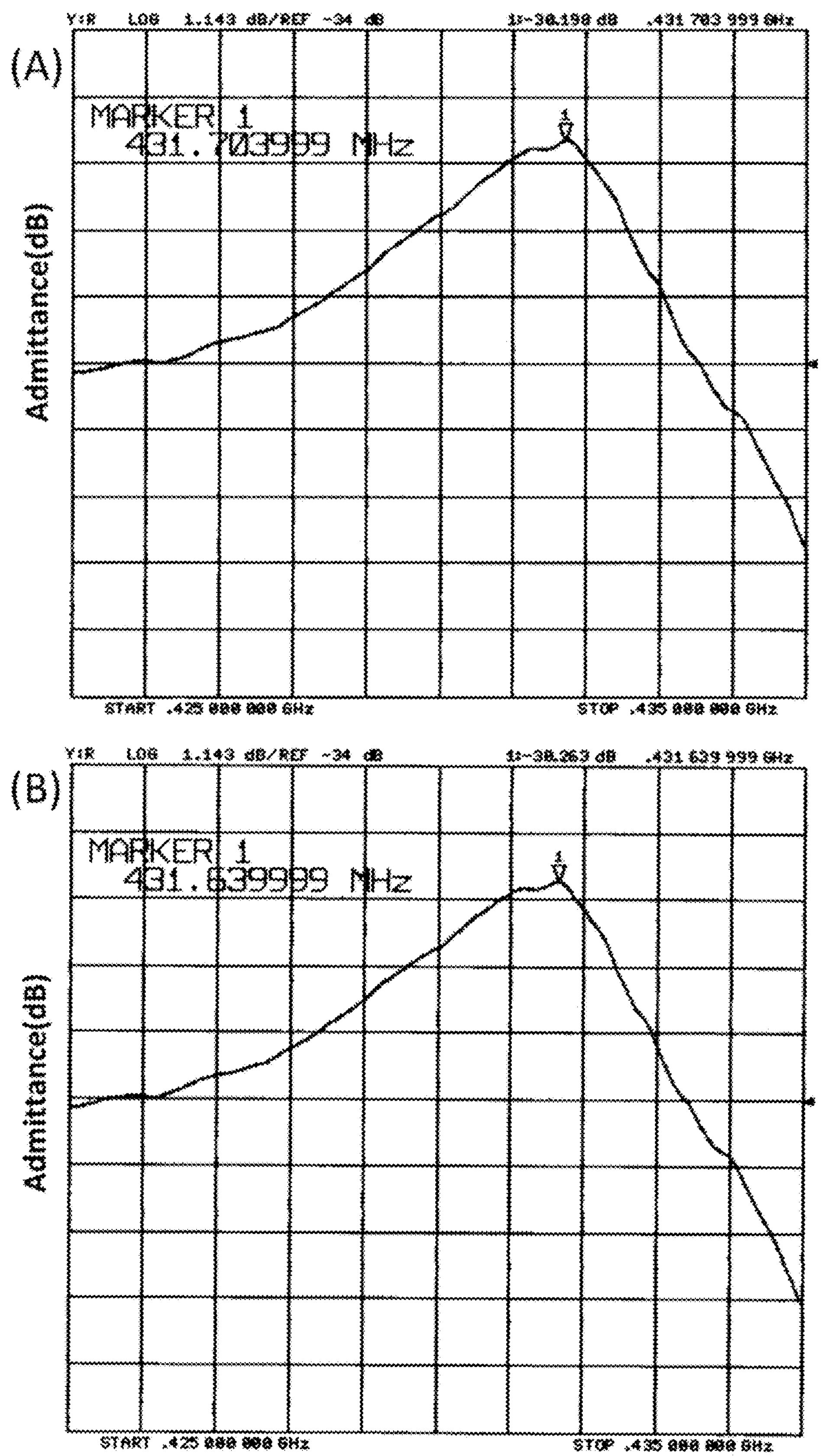
FIG. 18 is a graph showing a resonance admittance characteristic at (A) 20° C. and (B) 30° C. in an acoustic wave element having interdigital transducers made of an Au/Cr metal film on a 10° rotated Y-cut X-propagation $LiNbO_3$ substrate in the acoustic wave element in the fourth embodiment of the present invention (the abscissa shows frequency).
Figure 19:
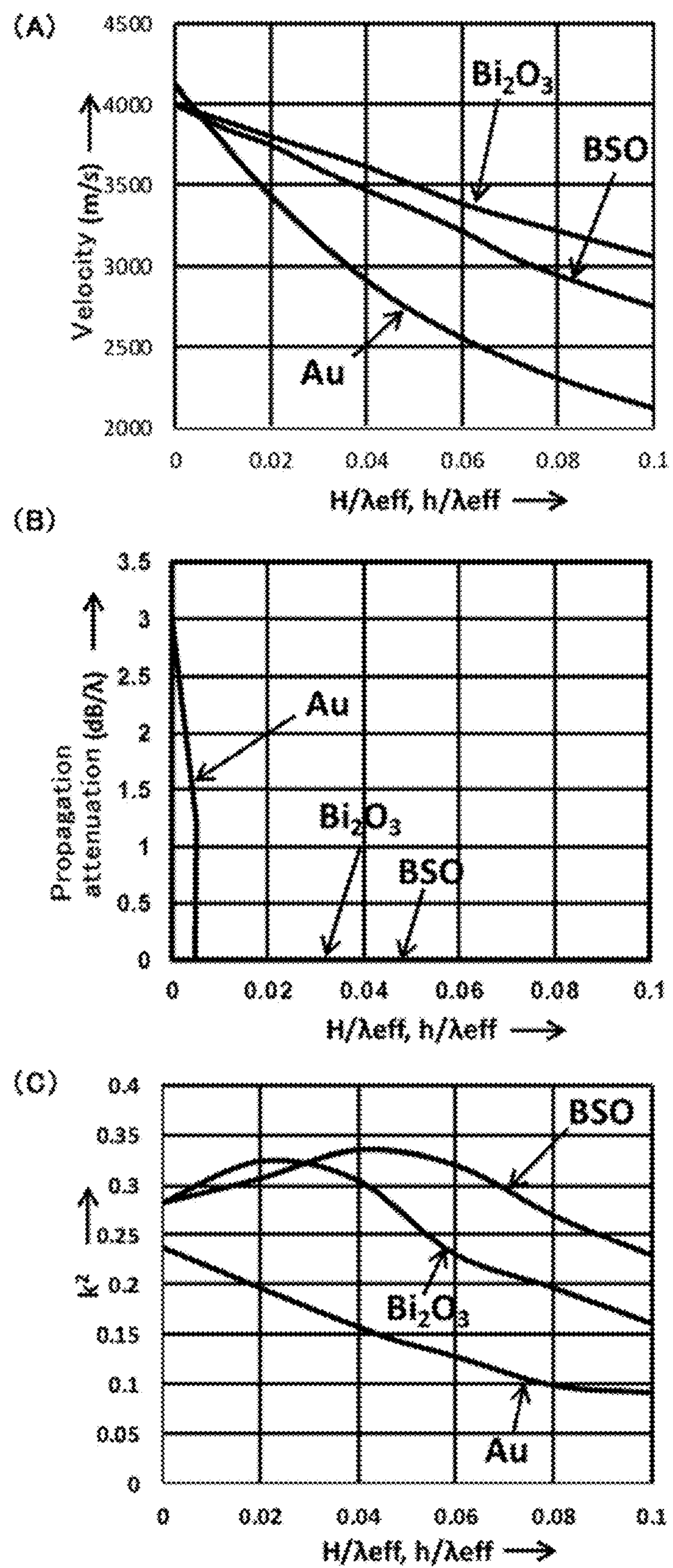
FIG. 19 is a graph showing changes of (A) a propagation velocity of a pseudo surface acoustic wave, (B) propagation attenuation of a pseudo surface acoustic wave, and (C) an electromechanical coupling coefficient $k^2$ of the piezoelectric substrate with respect to $H/\lambda_{eff}$ and $h/\lambda_{eff}$ (where $\lambda_{eff}$ is an operation wavelength) when an Al film is attached to the surface of a Y-cut X-propagation $LiNbO_3$ substrate, and a BSO thin film (film thickness: H) or a $Bi_2O_3$ thin film (film thickness: H) is further attached thereto, and when an Au thin film (film thickness: h) is attached to Y-cut X-propagation $LiNbO_3$ substrate in the acoustic wave element in the first to fourth embodiments of the present invention.

An acoustic wave element 70 having interdigital transducers 31 having an Au/Cr-structure on a 10° rotated Y-cut X-propagation $LiNbO_3$ substrate (piezoelectric substrate 11) was produced, and the resonance admittance characteristic at 20° C. and 30° C. were examined. The results are shown in FIGS. 18(A) and 18(B), respectively. When a temperature coefficient of frequency TCF is obtained from peak position at each temperature of the resonance admittance characteristic shown in FIG. 18, TCF is −15 ppm/° C. When this result is compared with the results of that of acoustic wave elements having a conventional structure shown in FIG. 13, it has been shown that use of the interdigital transducer film as the interdigital transducer 31 improves the temperature coefficient of frequency by +30 ppm/° C. even without using a dielectric film.

Example 4

Simulation was carried out with respect to a surface of the piezoelectric substrate 11 including a Y-cut X-propagation $LiNbO_3$ substrate to which an Al film (film thickness: $h_{Al}$) satisfying $h_{Al}/\lambda_{eff}=0.01$ was attached, and a BSO thin film (film thickness: H) or a $Bi_2O_3$ thin film (film thickness: H) as a dielectric film 13 was further attached thereon, and a surface of the piezoelectric substrate 11 including a Y-cut X-propagation $LiNbO_3$ substrate to which an Au thin film (film thickness: h) of a metal film as an interdigital transducer 31 was attached. In the simulation, changes of the propagation velocity of the pseudo-acoustic surface relative to the $H/\lambda_{eff}$ and $h/\lambda_{eff}$ (herein, $\lambda_{eff}$ represents an operation wavelength), the propagation attenuation, and an electromechanical coupling coefficient $k^2$ of the piezoelectric substrate 11 are obtained, respectively. The results are shown in FIGS. 19(A) to 19(C).

As shown in FIG. 19(A), it has been shown that when $h/\lambda_{eff}$ is 0.01, in the Au thin film, the propagation velocity is reduced by about 350 m/s from 4100 m/s to 3700 m/s. Similarly, in the BSO thin film and the $Bi_2O_3$ thin film, it has been shown that the propagation velocity is reduced by about 150 m/s. It has been shown that by using BSO, Au, $Bi_2O_3$ thin films, when $H/\lambda_{eff}$ and $h/\lambda_{eff}$ are 0.01, a large velocity dispersion characteristic of $0.033 \le (v_o - v_H)/v_o \le 0.09$ obtained, where $v_o$ is a velocity of the surface acoustic wave when a film thickness of the thin film is zero, and $v_H$ is a velocity of the surface acoustic wave when a film thickness of the thin film is H and h.

Furthermore, as shown in FIG. 19(B), it has been shown that, in the Au thin film, the propagation attenuation becomes zero when $h/\lambda_{eff}$ is 0.005 is more, and that in the BSO thin film and the $Bi_2O_3$ thin film, since an Al film satisfying $h_{Al}/\lambda_{eff}=0.01$ is attached, a surface acoustic wave whose propagation attenuation is zero can be obtained. Furthermore, as shown in FIG. 19(C), it has been shown that all thin films have the electromechanical coupling coefficient $k^2$ larger than any conventional thin films.

Figure 20:
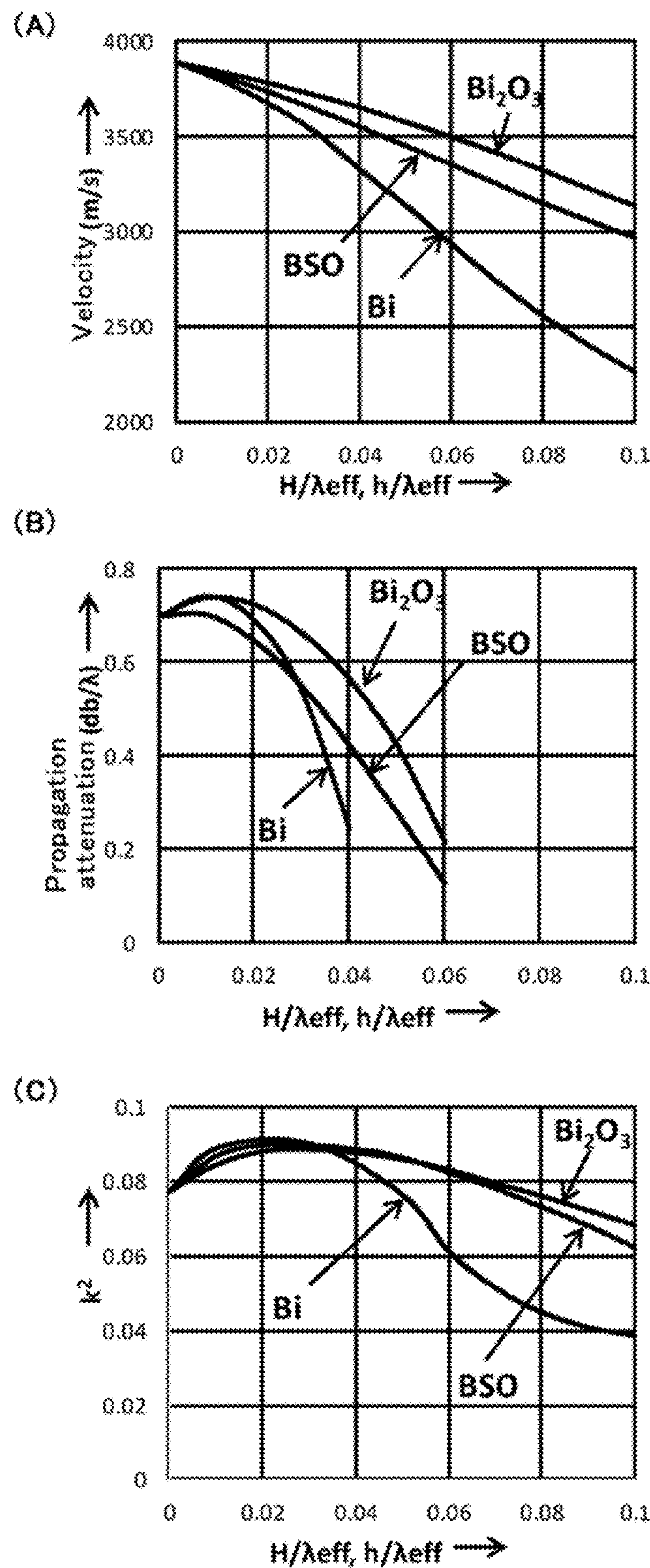
FIG. 20 is a graph showing changes of (A) a propagation velocity of a pseudo surface acoustic wave, (B) propagation attenuation of a pseudo surface acoustic wave, and (C) an electromechanical coupling coefficient $k^2$ of the piezoelectric substrate with respect to $H/\lambda_{eff}$ and $h/\lambda_{eff}$ (where $\lambda_{eff}$ is an operation wavelength) when an Al film is attached to a surface of a Y-cut X-propagation $LiTaO_3$ substrate, a $Bi_2O_3$ thin film (film thickness: H) or a BSO thin film (film thickness: H) is further attached thereto, and when a Bi film (film thickness: h) is attached to a surface of a Y-cut X-propagation $LiTaO_3$ substrate and an Al film is further attached thereto, in the acoustic wave element in the first to third embodiments of the present invention.
Figure 21:
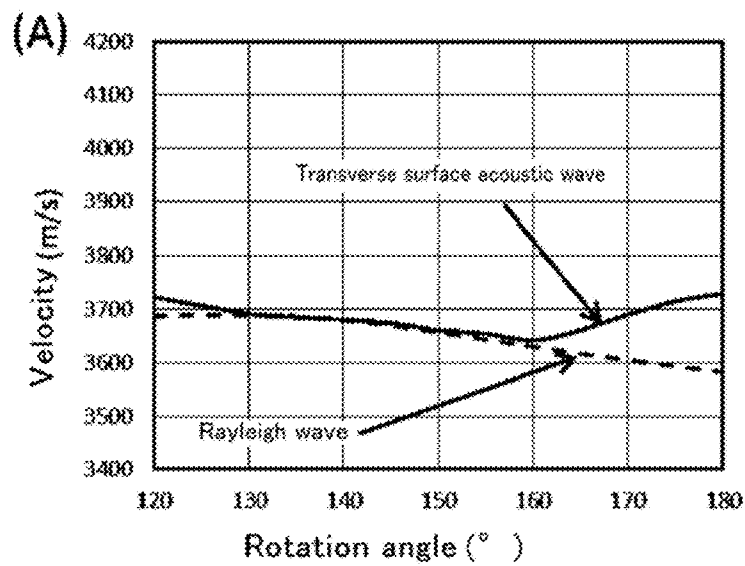
FIG. 21 is a graph showing changes of (A) a propagation velocity with respect to rotation angle, (B) an electromechanical coupling coefficient $k^2$ with respect to $H/\lambda_{eff}$ and $h/\lambda_{eff}$ (where $\lambda_{eff}$ is an operation wavelength), and (C) a propagation velocity with respect to $H/\lambda_{eff}$ when a rotation angle is 150° C. when an interdigital transducer of an Al film is attached to a surface of a 120° to 170° rotated Y-cut X-propagation $LiNbO_3$ substrate, and a BSO thin film (film thickness: H) is further attached thereto, in the acoustic wave element in the first to fourth embodiments of the present invention.
Figure 21:
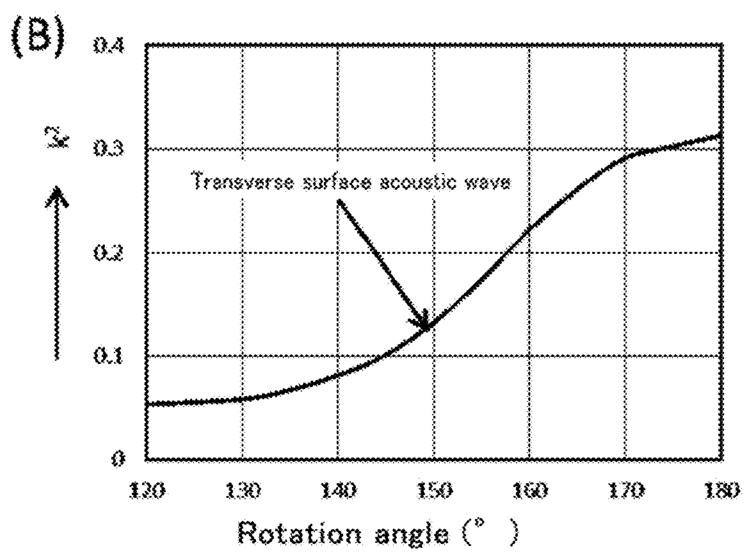
Figure 21:
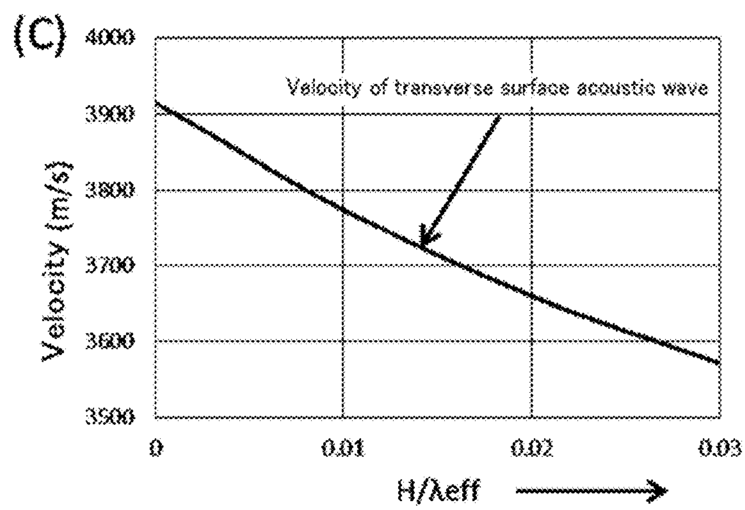

Next, simulation was carried out with respect to a surface of the piezoelectric substrate 11 including a Y-cut X-propagation $LiTaO_3$ substrate to which an Al film as an electrode material (film thickness: $h_{Al}$) satisfying $h_{Al}/\lambda_{eff}=0.01$ was attached, and a $Bi_2O_3$ thin film (film thickness: H) or a BSO thin film (film thickness: H) as a dielectric film 13 was further attached thereto, and a surface of the piezoelectric substrate 11 including a Y-cut X-propagation $LiTaO_3$ substrate to which a Bi thin film of a conductor (film thickness: h) was attached, and an Al film (film thickness: $h_{Al}$) satisfying $h_{Al}/\lambda_{eff}=0.01$ was further attached thereon. In the simulation, changes of the propagation velocity of the pseudo-acoustic surface relative to the $H/\lambda_{eff}$ and $h/\lambda_{eff}$, the propagation attenuation, and an electromechanical coupling coefficient $k^2$ of the piezoelectric substrate 11 are obtained, respectively. The results are shown in FIGS. 20(A) to 20 (C).

As shown in FIG. 20(A), it has been shown that a larger velocity dispersion characteristic is obtained by using Bi, $Bi_2O_3$, and BSO thin films. Furthermore, as shown in FIG. 20(B), the $Bi_2O_3$ thin film and the BGO thin film, the propagation attenuation becomes zero, respectively, when $H/\lambda_{eff}$ is 0.06 or more, and in the Bi thin film, the propagation attenuation becomes zero when $H/\lambda_{eff}$ is 0.04 or more, and a surface acoustic wave with energy confined to the surface of the piezoelectric substrate 11 was obtained. Furthermore, as shown in FIG. 20(C), it has been shown that all thin films have the electromechanical coupling coefficient $k^2$ larger than any conventional thin films. In this way, it has been shown that even when an Al film as an electrode material is sandwiched or loaded, by using a Bi thin film of a conductor, a $Bi_2O_3$ thin film or a BGO thin film of the dielectric film 13, a surface acoustic wave without propagation attenuation is obtained. Note here that since Bi is a conductor, it needs to be attached to the lower surface of an Al electrode.

Next, simulation was carried out with respect to a surface of the piezoelectric substrate 11 including a Y-cut X-propagation $LiNbO_3$ substrate (the acoustic velocity of propagating transverse wave is 4080 m/s) having a rotation angle of 120° to 170°, as the interdigital transducer 31, an Al thin film (film thickness: h) satisfying $h/\lambda_{eff}=0.01$ was attached, and a BSO film (film thickness: H) was further attached thereon. In the simulation, changes of the propagation velocity with respect to the rotation angle, the electromechanical coupling coefficient $k^2$ with respect to the rotation angle when $H/\lambda_{eff}$ is 0.02, and the propagation velocity with respect to $H/\lambda_{eff}$ when the rotation angle of 150° are obtained respectively. The results are shown in FIGS. 21(A) to 21(C).

As shown in FIG. 21(A), it has been shown that when the rotation angle is in the range from 130° to 150°, the propagation velocity of the Rayleigh wave and that of the transverse surface wave are the same and are degenerated, and a substrate without spurious characteristic can be obtained. Furthermore, as shown in FIG. 21(B), it has been shown that a large electromechanical coupling coefficient $k^2$ is obtained. Furthermore, as shown in FIG. 21(C), it has been shown that the velocity difference with respect to $H/\lambda_{eff}=0.01$ is as large as 130 m/s, and a substrate whose temperature coefficient of frequency is largely improved is obtained.

REFERENCE SIGNS LIST

10: Acoustic wave element (First Embodiment)
11: Piezoelectric substrate
11*a*: First surface
11*b*: Second surface
12: Electrode
13: Dielectric film
21: Support substrate
22*a*: First reflection film
22*b*: Second reflection film
30: Acoustic wave element (Second Embodiment)
31: Interdigital transducer
41*a*: Positive electrode side bus bar
41*b*: Positive electrode
42*a*: Negative electrode side bus bar
42*b*: Negative electrode
43: Reflection film
44: Reflector
50: Acoustic wave element (Third Embodiment)
70: Acoustic wave element (Fourth Embodiment)

What is claimed is:

1. An acoustic wave element comprising:

a piezoelectric substrate;

a pair of electrodes respectively provided on both surfaces of the piezoelectric substrate; and a dielectric film provided on at least any one surface of the piezoelectric substrate so as to cover an electrode provided on the surface, wherein the piezoelectric substrate is a 33° to 39° rotated Y-cut X-propagation $LiNbO_3$ substrate, a 161° to 167° rotated Y-cut X-propagation $LiNbO_3$ substrate, an $LiNbO_3$ substrate, a 44° to 50° rotated Y-cut X-propagation $LiTaO_3$ substrate, a 162° to 168° rotated Y-cut X-propagation $LiTaO_3$ substrate, an $LiTaO_3$ substrate, a langasite substrate, a quartz substrate, a ZnO substrate, a piezoelectric ceramics substrate, an AlN thin film substrate, a ZnO thin film substrate, a piezoelectric ceramics thin film substrate, or a ScAlN thin film substrate, in the dielectric film, an acoustic velocity of a propagating transverse wave is ⅔ times or less of an acoustic velocity of a slow transverse wave propagating through the piezoelectric substrate, and a surface acoustic wave velocity is 1010 m/s or more, and the dielectric film includes a $(Bi_2O_3)x(SiO_2 \text{ or } GeO_2)_{(1-x)}$ film wherein X is 0.3 to 1.0, a compound film including Bi, a BSO film, a BGO film, an $In_2O_3$ film, or a compound film including In.

2. The acoustic wave element according to claim 1, wherein an acoustic wave propagates in a direction perpendicular to each surface of the piezoelectric substrate, and a temperature coefficient of frequency is in a range from −20 ppm/° C. to +5 ppm/° C.

3. The acoustic wave element according to claim 1, wherein in each electrode, an acoustic velocity of a propagating transverse wave is ⅔ times or less of the acoustic velocity of the slow transverse wave propagating through the piezoelectric substrate, and the surface acoustic wave velocity is 1010 m/s or more.

4. The acoustic wave element according to claim 1, wherein $h/\lambda_{eff}$ =0.005 to 0.3 and $H/\lambda_{eff}$ =0.01 to 0.3 are satisfied where $\lambda_{eff}$ represents a wavelength of an acoustic wave propagating through the piezoelectric substrate, h represents a thickness of the each electrode or each of the interdigital transducers, and H represents a film thickness of the dielectric film.

5. The acoustic wave element according to claim 1, wherein each electrode or the interdigital transducers include an electrode film made of Au, Au/Cr, Ag, Ag/Cr, Bi, Bi/Cr, In, or an alloy of two or more thereof, or made of Al, Zn, Ru, Cr, Cu, Cu/Cr, Pt, Pt/Ti, or an alloy of two or more thereof, or made of Al, Zn, Ru, Cr, Cu, Cu/Cr, Pt, Pt/Cr, Pt/Ti, or an alloy of two or more thereof on Au, Au/Cr, Ag, Ag/Cr, Bi, Bi/Cr, In, or an alloy of two or more thereof.

6. The acoustic wave element according to claim 1, wherein a $SiO_2$ film or a dielectric film for temperature compensation is provided between the piezoelectric substrate provided with each electrode or the interdigital transducers and the dielectric film, or a $SiO_2$ film is provided on the dielectric film.

7. A method for manufacturing an acoustic wave element according to claim 1, the method comprising: vapor-depositing each electrode or the interdigital transducers, and/or the dielectric film at a temperature higher than a central operating temperature of the acoustic wave element by 100° C. or more, or at a temperature lower than the central operating temperature of the acoustic wave element by 100° C. or more.

8. An acoustic wave element comprising:

a piezoelectric substrate;

interdigital transducers provided on a first surface of the piezoelectric substrate; and a dielectric film provided on the interdigital transducers, wherein the piezoelectric substrate is a −10° to 75° rotated Y-cut X-propagation $LiNbO_3$ substrate, a 120° to 170° rotated Y-cut X-propagation $LiNbO_3$ substrate, a Y-Z $LiNbO_3$ substrate, an X-cut 35° to 45° Y-propagation $LiNbO_3$ substrate, an X-cut 160° to 175° Y-propagation $LiNbO_3$ substrate, an $LiNbO_3$ substrate, a −10° to 60° rotated Y-cut X-propagation $LiTaO_3$ substrate, an X-cut 35° to 45° Y-propagation $LiTaO_3$ substrate, an $LiTaO_3$ substrate, a langasite substrate, a quartz substrate, a ZnO substrate, a piezoelectric ceramics substrate, an AN thin film substrate, a ZnO thin film substrate, a piezoelectric ceramics thin film substrate, or a ScAlN thin film substrate, in the dielectric film, an acoustic velocity of a propagating transverse wave is ⅔ times or less of an acoustic velocity of a slow transverse wave propagating through the piezoelectric substrate, and a surface acoustic wave velocity is 1010 m/s or more and the dielectric film includes a $(Bi_2O_3)x(SiO_2 \text{ or } GeO_2)_{(1-x)}$ film wherein X is 0.3 to 1.0, a compound film including Bi, a BSO film, a BGO film, an $In_2O_3$ film, or a compound film including In.

9. The acoustic wave element according to claim 8, wherein an acoustic wave propagates along each surface of the piezoelectric substrate, and/or in a direction perpendicular to each surface of the piezoelectric substrate, and a temperature coefficient of frequency is in a range from −20 ppm/° C. to +5 ppm/° C.

10. The acoustic wave element according to claim 8, wherein in the interdigital transducers, an acoustic velocity of a propagating transverse wave is ⅔ times or less of the acoustic velocity of the slow transverse wave propagating through the piezoelectric substrate, and the surface acoustic wave velocity is 1010 m/s or more.

11. The acoustic wave element according to claim 8, wherein when a number of electrodes alternately arranged in the interdigital transducers is 2N+1, and when $\lambda_N$ is an operating center wavelength of the propagating acoustic wave, $V_N$ is a velocity of the acoustic wave at the time, $V_n$ is a velocity of the acoustic wave when the wavelength of the acoustic wave is represented by $\lambda n=\lambda_N[1+\{N-(n-1)\}\delta]$ where n is 1 to 2N+1, a value of $N\delta$ is 0.005 to 0.3, and a value of $a_n$ is 0.8 to 1.2, a width of an n-th electrode is represented by $L_n=X_n/2=a_n(\lambda_n/4)\times(V_n/V_N)$, and a center-to-center interval of neighboring electrodes is represented by $X_n=a_n(\lambda_n/2)\times(V_n/V_N)$.

* * * * *